United States Patent
Zhong et al.

(10) Patent No.: US 11,316,545 B2
(45) Date of Patent: Apr. 26, 2022

(54) DATA TRANSMISSION METHOD, COMMUNICATIONS DEVICE, AND STORAGE MEDIUM

(71) Applicant: HUAWEI TECHNOLOGIES CO., LTD., Guangdong (CN)

(72) Inventors: Qiwen Zhong, Shenzhen (CN); Xiaofei Xu, Beijing (CN); Xiaojun Zhang, Shenzhen (CN); Lehong Niu, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/913,691

(22) Filed: Jun. 26, 2020

(65) Prior Publication Data

US 2020/0328767 A1 Oct. 15, 2020

Related U.S. Application Data

(63) Continuation of application No. PCT/CN2018/119412, filed on Dec. 5, 2018.

(30) Foreign Application Priority Data

Dec. 29, 2017 (CN) .......................... 201711489045.X

(51) Int. Cl.
  *H04B 1/04* (2006.01)
  *H03M 7/30* (2006.01)
  *H04J 3/16* (2006.01)

(52) U.S. Cl.
  CPC ................ *H04B 1/04* (2013.01); *H03M 7/30* (2013.01); *H04J 3/16* (2013.01)

(58) Field of Classification Search
  CPC .......... H04B 1/04; H04L 1/0007; H04L 69/04; H03M 7/30; H04J 3/16; H04J 3/1658; H04J 3/1664; H04J 2203/0085; H04J 2203/0089
  See application file for complete search history.

(56) References Cited

U.S. PATENT DOCUMENTS

2007/0234172 A1* 10/2007 Chiabrera ............. H04L 1/0043
                                                                714/752
2007/0263533 A1   11/2007 Chiabrera
                    (Continued)

FOREIGN PATENT DOCUMENTS

CN      101335751 A    12/2008
CN      202799014 U     3/2013
                    (Continued)

OTHER PUBLICATIONS

EEE Std 802.3—2015, IEEE Standard for Ethernet, IEEE Computer Society, Sponsored by the LAN/MAN Standards Committee, Approved Sep. 3, 2015, 4017 pages.
(Continued)

*Primary Examiner* — David B Lugo
(74) *Attorney, Agent, or Firm* — Womble Bond Dickinson (US) LLP

(57) ABSTRACT

Embodiments of this application provide a data transmission method, a communications device, and a storage medium to reduce a quantity of cross-connections of an intermediate node in a network. In the embodiments of this application, Q first code block streams that are obtained are multiplexed into one second code block stream for transmission, a coding type of the first code block streams is M1/N1 bit coding, a coding type of the second code block stream is M2/N2 bit coding, and bits corresponding to code blocks in the Q first code block streams are carried in a payload area of a code block in the second code block stream. In other words, in the
(Continued)

solutions provided by the embodiments of this application, the code block streams are multiplexed and demultiplexed based on a code block granularity.

20 Claims, 21 Drawing Sheets

(56) References Cited

U.S. PATENT DOCUMENTS

| | | | |
|---|---|---|---|
| 2010/0080248 A1* | 4/2010 | Aweya | H04W 56/0055 |
| | | | 370/503 |
| 2010/0135315 A1* | 6/2010 | Fourcand | H04J 3/1611 |
| | | | 370/419 |
| 2011/0135312 A1 | 6/2011 | El-Ahmadi et al. | |
| 2012/0120967 A1 | 5/2012 | Ghiasi et al. | |
| 2013/0346823 A1 | 12/2013 | Cideciyan | |
| 2016/0308558 A1 | 10/2016 | Farhoodfar et al. | |
| 2017/0005742 A1 | 1/2017 | Gareau et al. | |
| 2017/0005901 A1* | 1/2017 | Gareau | H04L 43/10 |
| 2017/0230338 A1 | 8/2017 | Loprieno et al. | |
| 2018/0375763 A1* | 12/2018 | Brissette | H04L 49/35 |
| 2020/0396097 A1* | 12/2020 | Deng | H04J 3/1652 |
| 2021/0152898 A1* | 5/2021 | Li | H04B 10/27 |

FOREIGN PATENT DOCUMENTS

| | | |
|---|---|---|
| CN | 103684691 A | 3/2014 |
| CN | 106301678 A | 1/2017 |
| CN | 106341207 A | 1/2017 |
| CN | 106612203 A | 5/2017 |
| CN | 106788855 A | 5/2017 |
| EP | 3113502 A1 | 1/2017 |
| JP | 2001298490 A | 10/2001 |
| JP | 2003009219 A | 1/2003 |
| JP | 2003273939 A | 9/2003 |
| JP | 2017079367 A | 4/2017 |
| WO | 2016172765 A1 | 11/2016 |

OTHER PUBLICATIONS

IA OIF-FLEXE-01.1, Flex Ethernet Implementation Agreement, Jun. 21, 2017, 35 pages.

* cited by examiner

| 1 | 0 | 0x4B | MFI = 0 | | | Identifier of a first code block stream corresponding to a slot 0 | Identifier of a first code block stream corresponding to a slot 1 | 0xA | 0x000_0000 |
|---|---|---|---|---|---|---|---|---|---|
| 1 | 0 | 0x4B | MFI = 1 | | | Identifier of a first code block stream corresponding to a slot 2 | Identifier of a first code block stream corresponding to a slot 3 | 0xA | 0x000_0000 |
| 1 | 0 | 0x4B | MFI = 2 | | | Identifier of a first code block stream corresponding to a slot 4 | Identifier of a first code block stream corresponding to a slot 5 | 0xA | 0x000_0000 |
| 1 | 0 | 0x4B | MFI = 3 | | | Identifier of a first code block stream corresponding to a slot 6 | Identifier of a first code block stream corresponding to a slot 7 | 0xA | 0x000_0000 |
| 1 | 0 | 0x4B | MFI = 4 | | | Identifier of a first code block stream corresponding to a slot 8 | Identifier of a first code block stream corresponding to a slot 9 | 0xA | 0x000_0000 |
| ... | ... | ... | ... | | | ... | ... | ... | ... |
| 1 | 0 | 0x4B | MFI = E | | | Identifier of a first code block stream corresponding to a slot 28 | Identifier of a first code block stream corresponding to a slot 29 | 0xA | 0x000_0000 |
| 1 | 0 | 0x4B | MFI = F | | | Identifier of a first code block stream corresponding to a slot 30 | Identifier of a first code block stream corresponding to a slot 31 | 0xA | 0x000_0000 |

FIG. 16

DATA TRANSMISSION METHOD, COMMUNICATIONS DEVICE, AND STORAGE MEDIUM

CROSS-REFERENCE TO RELATED APPLICATIONS

This application is a continuation of International Application No. PCT/CN2018/119412, filed on Dec. 5, 2018, which claims priority to Chinese Patent Application No. 201711489045.X, filed on Dec. 29, 2017. The disclosures of the aforementioned applications are hereby incorporated by reference in their entireties.

TECHNICAL FIELD

Embodiments of this application relate to the communications field, and in particular, to a data transmission method, a communications device, and a storage medium.

BACKGROUND

The Optical Internet Forum (OIF) has released flexible Ethernet (FlexE). FlexE is a common technology supporting a plurality of Ethernet medium access control (MAC) layer rates. By bonding a plurality of 100GE (Physical, PHYs) ports and dividing each 100GE port into 20 slots in time domain by using fifth generation (5G) as a granularity, FlexE can support the following functions: bonding, that is, bonding a plurality of Ethernet ports into one link group to support a MAC service whose rate is higher than that of a single Ethernet port; subrate, that is, allocating a slot to a service to support a MAC service whose rate is lower than a bandwidth of a link group or lower than a bandwidth of a single Ethernet port; and channelization, that is, allocating a slot to a service to support simultaneous transmission of a plurality of MAC services in a link group, for example, supporting simultaneous transmission of one 150G MAC service and two 25G MAC services in a 2×100GE link group.

In FlexE, slots are obtained through division in time division multiplexing (TDM) mode, so that hard isolation of a transmission pipe bandwidth is implemented. One service data stream may be allocated to one or more slots, so that services of various rates are matched. A FlexE group (which may also be referred to as a FlexE group) may include one or more physical link interfaces (also expressed as PHY). For example, FIG. 1 is a schematic diagram of a communications system based on the flexible Ethernet protocol. As shown in FIG. 1, for example, a FlexE group includes four PHYs. A flexible Ethernet protocol client (FlexE client) represents a client data stream transmitted in a specified slot (one slot or a plurality of slots) on the FlexE group. One FlexE group may carry a plurality of FlexE clients. One FlexE client corresponds to one user service data stream (which may be typically referred to as a MAC Client). A flexible Ethernet protocol function layer (which may be referred to as a FlexE shim) provides data adaptation and conversion from a FlexE client to a MAC client.

Huawei Technologies released a new technology in an ITU-T IMT 2020 workshop in December 2016, where the technical architecture may be referred to as X-Ethernet (which may be referred to as X-Ethernet or X-E) for short, and is a new generation switch networking technology that is based on an Ethernet (which may be referred to as Ethernet) physical layer and has a deterministic ultra-low latency feature. One idea of the technology is switch networking based on a bit block (which may be referred to as a bit block) sequence, for example, an unscrambled 64B/66B bit block sequence, an equivalent 8B/10B bit block sequence, or a 9-bit block sequence including a 1-bit out-of-band control indicator and an 8-bit character on an Ethernet media independent interface xMII (for example, GMII, XGMII, or 25 GMII), but the technology lacks consideration of hierarchical multiplexing, and is not applicable to a large-scale networking application. For example, FIG. 2 is a schematic architecture diagram of an X-E communications system. As shown in FIG. 2, the communications system may include two types of communications devices: a first communications device 1011 and a second communications device 1012 in FIG. 2. The first communications device 1011 may also be described as a communications device at an operator network (referred to as a network for short hereinafter) edge, and may be referred to as a provider edge node, or may be referred to as a PE node for short. The second communications device 1012 may also be described as a communications device in the operator network (referred to as the network for short hereinafter), and may be referred to as a provider node, or may be referred to as a P node for short.

One side of the first communications device 1011 may be connected to user equipment, or may be connected to a user network device. An interface connected to the user equipment or the user network device may be relatively referred to as a user-side interface 1111 (UNI) or may be described as an interface for connecting a user to the network. The other side of the first communications device 1011 is connected to the second communications device 1012. As shown in FIG. 2, the other side of the first communications device 1011 is connected to the second communications device 1012 by using a network-to-network interface 1112 (NNI). The network-to-network interface 1112 may also be described as an interface between networks or between communications devices in the network. Optionally, the second communications device 1012 may be connected to another communications device (for example, which may be another second communications device or first communications device). In the figure, only one second communications device is shown as an example. A person skilled in the art may know that one or more connected communications devices may be included between two communications devices.

As shown in FIG. 2, an adapter (which may be referred to as an adaptor) may be configured on an interface side of a communications device. For example, a UNI-side adapter (which may be referred to as a U-adaptor) 1113 is configured on a UNI 1111 side, and an adapter (which may be referred to as an N-adaptor) 1114 is configured on an NNI 1112 side. In end-to-end networking of network devices based on X-E interfaces, an X-E switching module 1115 (which may be referred to as an X-E switch) may be configured in the first communications device and the second communications device. For example, FIG. 2 is a schematic diagram of an end-to-end path 1116.

Currently, end-to-end networking based on FlexE interfaces is used for X-E, and is flat non-hierarchical networking switching. The OIF FlexE currently defines a 5 Gbps rate slot (SLOT) granularity based on a 64B/66B bit block (referred to as 64B/66B for short hereinafter). Several slots whose total bandwidth/rate is Q*5 Gbps (a value range of Q is an integer greater than or equal to 1) may be allocated on a FlexE-based NNI or UNI to carry any FlexE client. The P node of the X-E network needs to parse and extract each FlexE client and perform switching processing. However, this lacks consideration of hierarchical multiplexing. For example, FIG. 3 is a schematic diagram of communication in which an X-Ethernet flat networking technology is applied to end-to-end networking of a metropolitan area network and a backbone network. Tens of thousands of private line services between a plurality of cities need to be scheduled. A convergence node (convergence shown in FIG. 3) and a backbone node (backbone shown in FIG. 3) need to manage hundreds of thousands of or millions of end-to-end cross-connections. There is difficulty in management, operation, and maintenance. Each core node (for example, a convergence node and a backbone node) has difficulty and pressure in processing a large quantity of cross connections on a data plane.

SUMMARY

Embodiments of this application provide a data transmission method, a communications device, and a storage medium to reduce pressure caused by a quantity of cross-connections of an intermediate node in a network to the intermediate node and reduce pressure in network management, operation, and maintenance.

According to a first aspect, an embodiment of this application provides a data transmission method, where the method includes: obtaining Q first code block streams, where Q is an integer greater than 1, a coding type of the first code block streams is M1/N1 bit coding, M1 is a positive integer, and N1 is an integer not less than M1; and placing, in a to-be-sent second code block stream, bits corresponding to code blocks in the Q first code block streams, where a coding type of the second code block stream is M2/N2 bit coding, bits corresponding to a code block in the Q first code block streams are carried in a payload area of a code block in the second code block stream, M2 is a positive integer, a quantity of bits carried in a payload area of one code block in the second code block stream is not greater than M2, and N2 is an integer not less than M2. In the solution provided by this embodiment of this application, the code block streams are multiplexed and demultiplexed based on a code block granularity. In this way, the second code block stream traverses at least one intermediate node to reach a communications device on a demultiplexing side, and the intermediate node does not perform demultiplexing on the second code block stream. Therefore, a quantity of cross-connections of the intermediate node in a network can be reduced, and pressure in network management, operation, and maintenance can also be reduced.

In an optional embodiment, the placing, in a to-be-sent second code block stream, bits corresponding to code blocks in the Q first code block streams may be sequentially placing, in a payload area of a code block in the second code block stream, a synchronization header area and a non-synchronization header area of one code block in the Q first code block streams. In this way, a synchronization header area and a non-synchronization area of a code block in a first code block stream can be sequentially demultiplexed.

In an optional embodiment, all bits corresponding to a synchronization header area and a non-synchronization header area of one code block in the Q first code block streams are correspondingly placed in payload areas of at least two code blocks in the second code block stream. Therefore, when a total quantity of bits carried in one code block in a first code block stream is greater than a quantity of bits carried in a payload area of one code block in the second code block stream, this manner can be used to implement multiplexing of code blocks in the first code block stream. For example, if coding modes of the first code block stream and the second code block stream are both 64B/66B coding, when the first code block stream is not compressed, payload areas of two code blocks in the second code block stream may be used to carry bits corresponding to one code block in the first code block stream.

In an optional embodiment, the second code block stream corresponds to at least one data unit; and one data unit in the at least one data unit includes a head code block and at least one data code block, or one data unit in the at least one data unit includes a head code block, at least one data code block, and a tail code block, or one data unit in the at least one data unit includes at least one data code block and a tail code block. In this way, the data unit may be delimited by using the head code block and/or the tail code block. Therefore, a communications device is enabled to identify a boundary of each data unit in the second code block stream. This lays a basis for demultiplexing the Q first code block streams.

In an optional embodiment, the at least one data code block includes at least one type-1 data code block, bits corresponding to a code block in the Q first code block streams are carried in a payload area of a type-1 data code block in the at least one type-1 data code block in the second code block stream, and a quantity of bits carried in a payload area of one type-1 data code block in the second code block stream is M2. In this way, the code blocks in the first code block streams can be carried in the second code block stream. Therefore, multiplexing of the code block streams based on the code block granularity is implemented, and efficiency of data transmission is improved.

In an optional embodiment, for compatibility with prior approaches, the head code block is an S code block, and/or the tail code block is a T code block.

In an optional embodiment, for one code block in the Q first code block streams carried in the second code block stream, the second code block stream further includes identifier indication information corresponding to the code block, where the identifier indication information is used to indicate a first code block stream corresponding to the code block. In this way, the identifier indication information may be used to indicate, to the communications device on the demultiplexing side, an identifier of the first code block stream corresponding to the code block that is obtained from the first code block stream and carried in the second code block stream. This can lay a basis for demultiplexing the Q first code block streams by the communications device on the demultiplexing side.

In an optional embodiment, the placing, in a to-be-sent second code block stream, bits corresponding to code blocks in the Q first code block streams includes: performing code-block-based time division multiplexing on the code blocks in the Q first code block streams to obtain a to-be-processed code block sequence, where each of the Q first code block streams corresponds to at least one slot, and an order of code blocks included in the to-be-processed code block sequence matches an order of slots corresponding to the code blocks included in the to-be-processed code block sequence; and placing, in the to-be-sent second code block stream, bits corresponding to the to-be-processed code block sequence. In this way, the demultiplexing side can determine, based on a relationship between the order of the code blocks and the order of the slots, slots corresponding to the code blocks that are obtained from the Q first code block streams and included in the to-be-processed code block sequence, and further determine, based on a correspondence between slots and the Q first code block streams, a first code block stream corresponding to each code block, and further restore the Q first code block streams carried in the second code block stream.

In an optional embodiment, slot allocation indication information is carried in a preset code block in the second code block stream; and the slot allocation indication information is used to indicate a correspondence between the Q first code block streams and slots. The correspondence between the slots and the first code block streams is notified to the demultiplexing side by using the slot allocation indication information, making it possible for a communications device on a multiplexing side to allocate the slots to the Q first code block streams more flexibly.

In an optional embodiment, the placing, in the to-be-sent second code block stream, bits corresponding to the to-be-processed code block sequence includes: compressing R continuous code blocks in the to-be-processed code block sequence to obtain a compressed code block sequence, where R is a positive integer; and placing, in the to-be-sent second code block stream, bits corresponding to the compressed code block sequence. In this way, a quantity of bits corresponding to the first code block streams carried in the second code block stream can be reduced, and efficiency of data transmission is improved.

In an optional embodiment, if R is greater than 1, the R continuous code blocks include at least two code blocks, and two first code block streams from which two code blocks are obtained are two different first code block streams. To be specific, in this embodiment of this application, a plurality of code blocks from different first code block streams may be compressed. Therefore, an effect of compressing a plurality of code blocks in the code block multiplexing and demultiplexing solution and further improving transmission efficiency is achieved.

In an optional embodiment, a coding form of the compressed code block sequence is M3/N3, M3 is a positive integer, and N3 is an integer not less than M3; and a quantity of type-1 data code blocks included in one data unit in the at least one data unit included in the second code block stream is determined based on M2 and a common multiple of N3 and M2, or a quantity of type-1 data code blocks included in one data unit in the at least one data unit included in the second code block stream is determined based on M2 and a least common multiple of N3 and M2. In this way, an integer number of code blocks in a first code block stream can be loaded into one data unit in the second code block stream (this form may also be described as boundary alignment).

In an optional embodiment, after the Q first code block streams are received, and before the bits corresponding to the code blocks in the Q first code block streams are placed in the to-be-sent second code block stream, the method further includes: for a first code block stream in the Q first code block streams, performing addition or deletion processing of an idle code block on the first code block stream based on a bandwidth of the first code block stream and a total bandwidth of slots corresponding to the first code block stream, where the total bandwidth of slots corresponding to the first code block stream is determined based on a quantity of slots corresponding to the first code block stream and a bandwidth allocated to each slot corresponding to the first code block stream. In this way, adaptation between a rate of the first code block stream and a total rate corresponding to slots allocated to the first code block stream can be implemented.

According to a second aspect, an embodiment of this application provides a data transmission method, where the method includes: receiving a second code block stream, where bits corresponding to a code block in Q first code block streams are carried in a payload area of a code block in the second code block stream, Q is an integer greater than 1, a coding type of the first code block streams is M1/N1 bit coding, M1 is a positive integer, N1 is an integer not less than M1, a coding type of the second code block stream is M2/N2 bit coding, M2 is a positive integer, a quantity of bits carried in a payload area of one code block in the second code block stream is not greater than M2, and N2 is an integer not less than M2; and demultiplexing the Q first code block streams. In the solution provided by this embodiment of this application, the code block streams are multiplexed and demultiplexed based on a code block granularity. In this way, the second code block stream traverses at least one intermediate node to reach a communications device on a demultiplexing side, and the intermediate node does not perform demultiplexing on the second code block stream. Therefore, pressure caused by a quantity of cross-connections of the intermediate node in a network to the intermediate node can be reduced and pressure in network management, operation, and maintenance can also be reduced.

In an optional embodiment, a synchronization header area and a non-synchronization header area of one code block in the Q first code block streams are sequentially placed in a payload area of a code block in the second code block stream. In this way, a synchronization header area and a non-synchronization area of a code block in a first code block stream can be sequentially demultiplexed.

In an optional embodiment, all bits corresponding to a synchronization header area and a non-synchronization header area of one code block in the Q first code block streams are correspondingly placed in payload areas of at least two code blocks in the second code block stream. Therefore, when a total quantity of bits carried in one code block in a first code block stream is greater than a quantity of bits carried in a payload area of one code block in the second code block stream, this manner can be used to implement multiplexing of code blocks in the first code block stream. For example, if coding modes of the first code block stream and the second code block stream are both 64B/66B coding, when the first code block stream is not compressed, payload areas of two code blocks in the second code block stream may be used to carry bits corresponding to one code block in the first code block stream.

In an optional embodiment, the second code block stream corresponds to at least one data unit; and one data unit in the at least one data unit includes a head code block and at least one data code block, or one data unit in the at least one data unit includes a head code block, at least one data code block, and a tail code block, or one data unit in the at least one data unit includes at least one data code block and a tail code block. In this way, the data unit may be delimited by using the head code block and/or the tail code block. Therefore, a communications device is enabled to identify a boundary of each data unit in the second code block stream. This lays a basis for demultiplexing the Q first code block streams.

In an optional embodiment, the at least one data code block includes at least one type-1 data code block, bits corresponding to a code block in the Q first code block streams are carried in a payload area of a type-1 data code block in the at least one type-1 data code block in the second code block stream, and a quantity of bits carried in a payload area of one type-1 data code block in the second code block stream is M2. In this way, the code blocks in the first code block streams can be carried in the second code block stream. Therefore, multiplexing of the code block streams based on the code block granularity is implemented, and efficiency of data transmission is improved.

In an optional embodiment, for compatibility with prior approaches, the head code block is an S code block, and/or the tail code block is a T code block.

In an optional embodiment, for one code block in the Q first code block streams carried in the second code block stream, the second code block stream further includes identifier indication information corresponding to the code block, where the identifier indication information is used to indicate a first code block stream corresponding to the code block. In this way, the identifier indication information may be used to indicate, to the communications device on the demultiplexing side, an identifier of the first code block stream corresponding to the code block that is obtained from the first code block stream and carried in the second code block stream. This can lay a basis for demultiplexing the Q first code block streams by the communications device on the demultiplexing side.

In an optional embodiment, the demultiplexing the Q first code block streams includes: obtaining bits corresponding to code blocks in the Q first code block streams carried in the payload area of the second code block stream, to obtain a to-be-decompressed code block sequence; and demultiplexing the Q first code block streams based on the to-be-decompressed code block sequence. Bits corresponding to a code block in the Q first code block streams carried in the payload area of the second code block stream are obtained and determined as a code block granularity, and further, the to-be-decompressed code block sequence is formed. Further, an identifier of a first code block stream corresponding to each code block in the to-be-decompressed code block sequence is determined, and the Q first code block streams are demultiplexed. In this way, demultiplexing based on the code block granularity is implemented.

In an optional embodiment, if one code block in the to-be-decompressed code block sequence is obtained by compressing at least two code blocks, the at least two code blocks correspond to two different first code block streams. To be specific, in this embodiment of this application, a plurality of code blocks from different first code block streams may be compressed. Therefore, an effect of compressing a plurality of code blocks in the code block multiplexing and demultiplexing solution and further improving transmission efficiency is achieved.

In an optional embodiment, slot allocation indication information is carried in a preset code block in the second code block stream; and the slot allocation indication information is used to indicate a correspondence between the Q first code block streams and slots. The correspondence between the slots and the first code block streams is notified to the demultiplexing side by using the slot allocation indication information, making it possible for a communications device on a multiplexing side to allocate the slots to the Q first code block streams more flexibly.

In an optional embodiment, the demultiplexing the Q first code block streams based on the to-be-decompressed code block sequence includes: decompressing the to-be-decompressed code block sequence to obtain a to-be-restored code block sequence; and determining, based on the to-be-restored code block sequence, a first code block stream corresponding to each code block in the to-be-restored code block sequence, to obtain the Q first code block streams, where each of the Q first code block streams corresponds to at least one slot, and an order of code blocks included in the to-be-restored code block sequence matches an order of slots corresponding to the code blocks included in the to-be-restored code block sequence. In this way, the demultiplexing side can determine, based on a relationship between the order of the code blocks and the order of the slots, slots corresponding to the code blocks that are obtained from the Q first code block streams and included in the to-be-restored code block sequence, and further determine, based on the correspondence between the slots and the Q first code block streams, a first code block stream corresponding to each code block, and further restore the Q first code block streams carried in the second code block stream.

In an optional embodiment, a coding form of the compressed code block sequence is M3/N3, M3 is a positive integer, and N3 is an integer not less than M3; and a quantity of type-1 data code blocks included in one data unit in the at least one data unit included in the second code block stream is determined based on M2 and a common multiple of N3 and M2, or a quantity of type-1 data code blocks included in one data unit in the at least one data unit included in the second code block stream is determined based on M2 and a least common multiple of N3 and M2. In this way, an integer number of code blocks in a first code block stream can be loaded into one data unit in the second code block stream (this form may also be described as boundary alignment).

According to a third aspect, an embodiment of this application provides a communications device, where the communications device includes a memory, a transceiver, and a processor, where the memory is configured to store an instruction; the processor is configured to execute the instruction stored in the memory, and control the transceiver to receive a signal and send a signal; and when the processor executes the instruction stored in the memory, the communications device is configured to perform the first aspect or any method in the first aspect.

According to a fourth aspect, an embodiment of this application provides a communications device, where the communications device includes a memory, a transceiver, and a processor, where the memory is configured to store an instruction; the processor is configured to execute the instruction stored in the memory, and control the transceiver to receive a signal and send a signal; and when the processor executes the instruction stored in the memory, the communications device is configured to perform the second aspect or any method in the second aspect.

According to a fifth aspect, an embodiment of this application provides a communications device, configured to implement the first aspect or any method in the first aspect, and including corresponding functional modules respectively configured to implement steps in the foregoing method. A function may be implemented by hardware, or may be implemented by corresponding software executed by hardware. The hardware or software includes one or more modules corresponding to the foregoing functions.

In a possible design, a structure of the communications device includes a multiplexing/demultiplexing unit and a transceiver unit. The units may perform corresponding functions in the foregoing method example. For details, refer to detailed descriptions in the method example. Details are not described again herein.

According to a sixth aspect, an embodiment of this application provides a communications device, configured to implement the second aspect or any method in the second aspect, and including corresponding functional modules respectively configured to implement steps in the foregoing method. A function may be implemented by hardware, or may be implemented by corresponding software executed by hardware. The hardware or software includes one or more modules corresponding to the foregoing functions.

In a possible design, a structure of the communications device includes a multiplexing/demultiplexing unit and a transceiver unit. The units may perform corresponding functions in the foregoing method example. For details, refer to detailed descriptions in the method example. Details are not described again herein.

According to a seventh aspect, an embodiment of this application provides a computer storage medium, where the computer storage medium stores an instruction, and when the instruction is run on a computer, the computer is enabled to perform the method in the first aspect or any possible embodiment of the first aspect.

According to an eighth aspect, an embodiment of this application provides a computer storage medium, where the computer storage medium stores an instruction, and when the instruction is run on a computer, the computer is enabled to perform the method in the second aspect or any possible embodiment of the second aspect.

According to a ninth aspect, an embodiment of this application provides a computer program product including an instruction, where when the computer program product is run on a computer, the computer is enabled to perform the method in the first aspect or any possible embodiment of the first aspect.

According to a tenth aspect, an embodiment of this application provides a computer program product including an instruction, where when the computer program product is run on a computer, the computer is enabled to perform the method in the second aspect or any possible embodiment of the second aspect.

BRIEF DESCRIPTION OF DRAWINGS

FIG. 16 is a schematic structural diagram of slot allocation indication information transmitted in a second code block stream according to an embodiment of this application;

DESCRIPTION OF EMBODIMENTS

It should be understood that, the technical solutions in embodiments of this application may be applied to various communications systems, for example, communications systems based on an Ethernet technology in fields of mobile bearer fronthaul or backhaul, metropolitan multi-service bearing, data center interconnection, industrial communication, and the like, and a system for communication between different components or modules in an industrial device or a communications device.

Figure 4:
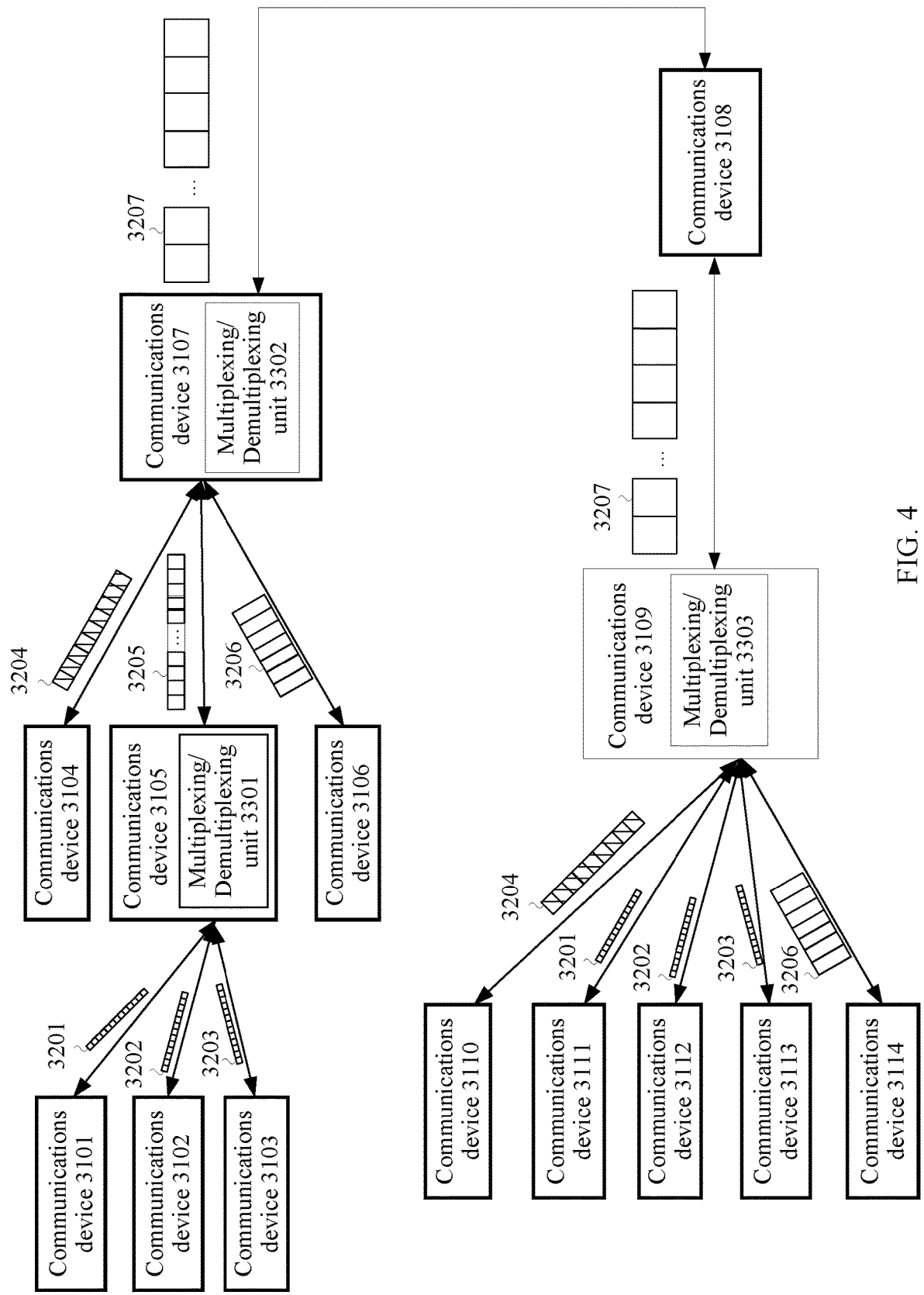
FIG. 4 is a schematic architecture diagram of a communications system to which an embodiment of this application is applicable.

For example, FIG. 4 is a schematic architecture diagram of a communications system to which an embodiment of this application is applicable. As shown in FIG. 4, the communications system includes a plurality of communications devices, and code block streams are transmitted between the communications devices.

A communications device in this embodiment of this application may be a network device, for example, may be a communications device referred to as a PE node at a network edge in an X-E network, or may be a communications device referred to as a P node in a network in an X-E network, or may be used as user equipment for accessing another bearer network, for example, an optical transport network (OTN) or wavelength division multiplexing (WDM).

As shown in FIG. 4, the communications device provided in this embodiment of this application has a multiplexing/ demultiplexing unit, for example, a multiplexing/demultiplexing unit 3301 in a communications device 3105, a multiplexing/demultiplexing unit 3302 in a communications device 3107, and a multiplexing/demultiplexing unit 3303 in a communications device 3109, as shown in FIG. 4. The communications device having the multiplexing/demultiplexing unit may implement multiplexing on a plurality of received code streams (multiplexing in this embodiment of this application may also be referred to as multiplexing in some documents), or may implement demultiplexing on a received code stream (demultiplexing in this embodiment of this application may also be referred to as demultiplexing in some documents). The following uses an example for description with reference to FIG. 4.

In FIG. 4, a communications device 3101 outputs a code block stream 3201 to the communications device 3105; a communications device 3102 outputs a code block stream 3202 to the communications device 3105; and a communications device 3103 outputs a code block stream 3203 to the communications device 3105. The communications device 3105 includes the multiplexing/demultiplexing unit 3301. The communications device 3105 may multiplex the received code block stream 3201, code block stream 3202, and code block stream 3203 into one code block stream 3205 for transmission.

Further, multi-level multiplexing may be implemented in this embodiment of this application. For example, the communications device 3105 in FIG. 4 may output the code block stream 3205 to the communications device 3107. The code block stream 3205 is a multiplexed code block stream. The communications device 3107 may re-multiplex, by using the multiplexing/demultiplexing unit 3302, a code block stream 3204 output by a communications device 3104, a code block stream 3206 output by a communications device 3106, and the multiplexed code block stream 3205 output by the communications device 3105, and output a multiplexed code block stream 3207. In other words, the communications device 3107 multiplexes the code block stream 3204, the multiplexed code block stream 3205, and the code block stream 3206 into one code block stream 3207.

The multiplexed code block stream 3207 may be transmitted between the communications device 3107 and a communications device 3108 and the communications device 3109. The multiplexing/demultiplexing unit in the communications device may further have a demultiplexing function. The multiplexing/demultiplexing unit 3303 in the communications device 3109 shown in FIG. 4 may perform demultiplexing on the received code block stream 3207, and send the demultiplexed code block streams to corresponding communications devices, for example, send the demultiplexed code block stream 3204 to a communications device 3110, send the demultiplexed code block stream 3201 to a communications device 3111, send the demultiplexed code block stream 3202 to a communications device 3112, send the demultiplexed code block stream 3203 to a communications device 3113, and send the demultiplexed code block stream 3206 to a communications device 3114.

In an optional embodiment, the multiplexing/demultiplexing unit 3303 may first demultiplex the code block stream 3204, the code block stream 3205, and the code block stream 3206 from the code block stream 3207, and further the multiplexing/demultiplexing unit 3303 demultiplexes the code block stream 3201, the code block stream 3202, and the code block stream 3203 from the code block stream 3205. In an optional embodiment, the multiplexing/demultiplexing unit 3303 in the communications device 3109 in FIG. 4 may include two sub multiplexing/demultiplexing units, where one sub multiplexing/demultiplexing unit is configured to demultiplex the code block stream 3204, the code block stream 3205, and the code block stream 3206 from the code block stream 3207, and send the code block stream 3205 to the other sub multiplexing/demultiplexing unit, and the other sub multiplexing/demultiplexing unit demultiplexes the code block stream 3201, the code block stream 3202, and the code block stream 3203 from the code block stream 3205.

Figure 5:
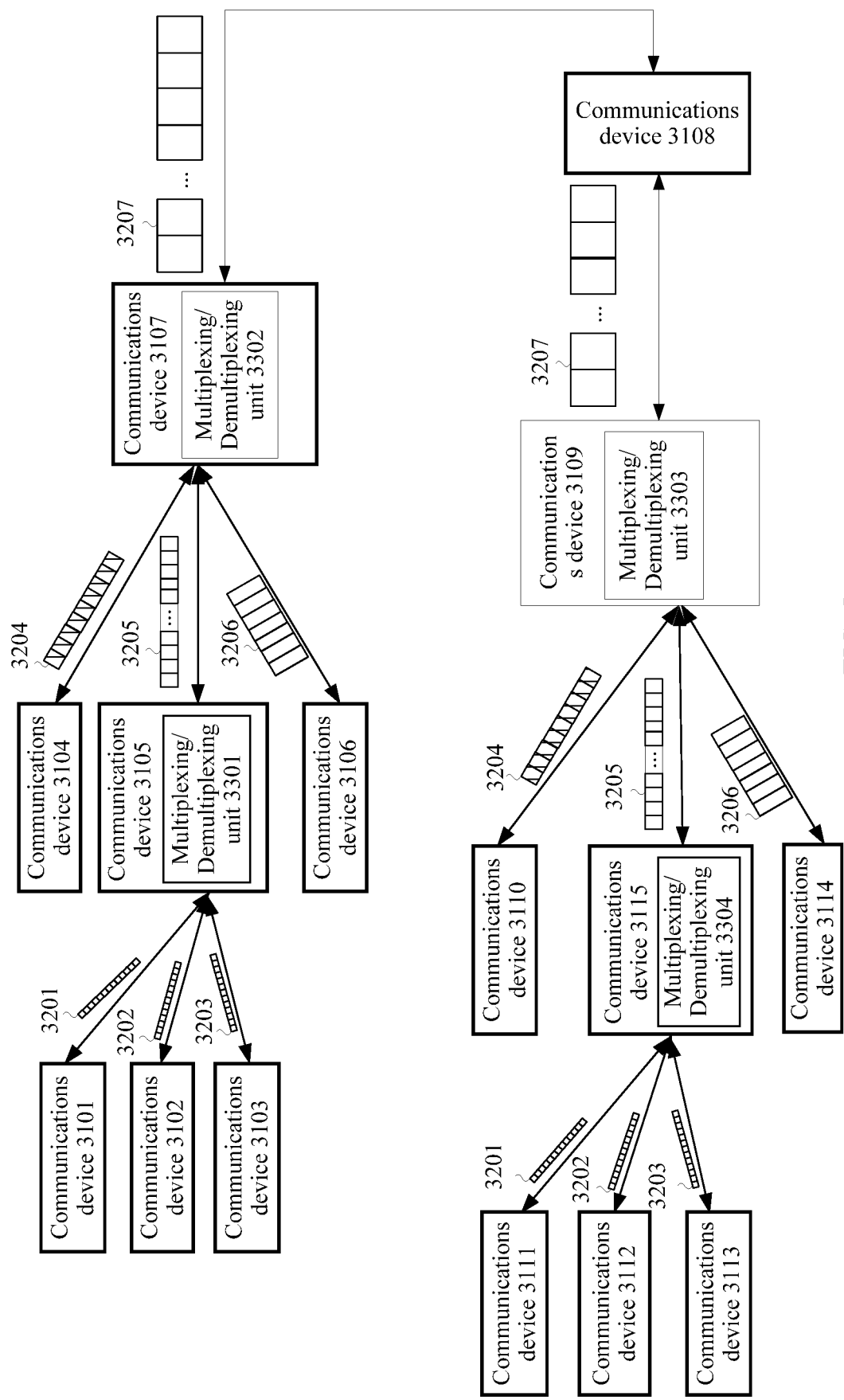
FIG. 5 is a schematic architecture diagram of another communications system to which an embodiment of this application is applicable.

For example, FIG. 5 provides a schematic architecture diagram of another communications system to which an embodiment of this application is applicable. As shown in FIG. 5, a process of receiving a code block stream 3207 by a communications device 3109 is consistent with that in FIG. 4, and is not described again herein. A difference from the solution shown in FIG. 4 lies in that, a multiplexing/demultiplexing unit 3303 in the communications device 3109 demultiplexes a code block stream 3204, a code block stream 3205, and a code block stream 3206 from the received code block stream 3207, sends the code block stream 3204 to a communications device 3110, sends the code block stream 3205 to a communications device 3115, and sends the code block stream 3204 to a communications device 3114. A multiplexing/demultiplexing unit 3304 in the communications device 3115 demultiplexes a code block stream 3201, a code block stream 3202, and a code block stream 3203 from the received code block stream 3205, sends the code block stream 3201 to a communications device 3111, sends the code block stream 3202 to a communications device 3112, and sends the code block stream 3203 to a communications device 3113.

To be specific, in this embodiment of this application, a multiplexing side and a demultiplexing side may be both configured flexibly. For example, in FIG. 4, two-level multiplexing is performed by using the multiplexing/demultiplexing unit 3301 and the multiplexing/demultiplexing unit 3302, to obtain the code block stream 3207; but on the demultiplexing side, as shown in FIG. 4, the multiplexing/demultiplexing unit 3303 demultiplexes the code block stream 3204, the code block stream 3201, the code block stream 3202, the code block stream 3203, and the code block stream 3206 from the code block stream; or as shown in FGI. 5, first, the multiplexing/demultiplexing unit 3303 demultiplexes the code block stream 3204, the code block stream 3205, and the code block stream 3206 from the received code block stream 3207, and then the multiplexing/demultiplexing unit 3304 demultiplexes the code block stream 3201, the code block stream 3202, and the code block stream 3203 from the received code block stream 3205.

As can be seen from the solution shown in FIG. 4 and FIG. 5, only one code block stream is transmitted between the communications device 3107 and the communications device 3108 and the communications device 3109, and communications devices on the transmission path only need to process one multiplexed code block stream, without parsing a plurality of multiplexed code block streams. Obviously, applying the solution provided by this embodiment of this application can reduce a quantity of cross-connections of an intermediate node (the intermediate node may be the communications device 3108 in FIG. 4, or the like) and reduce workload in network management, operation, and maintenance.

Figure 1:
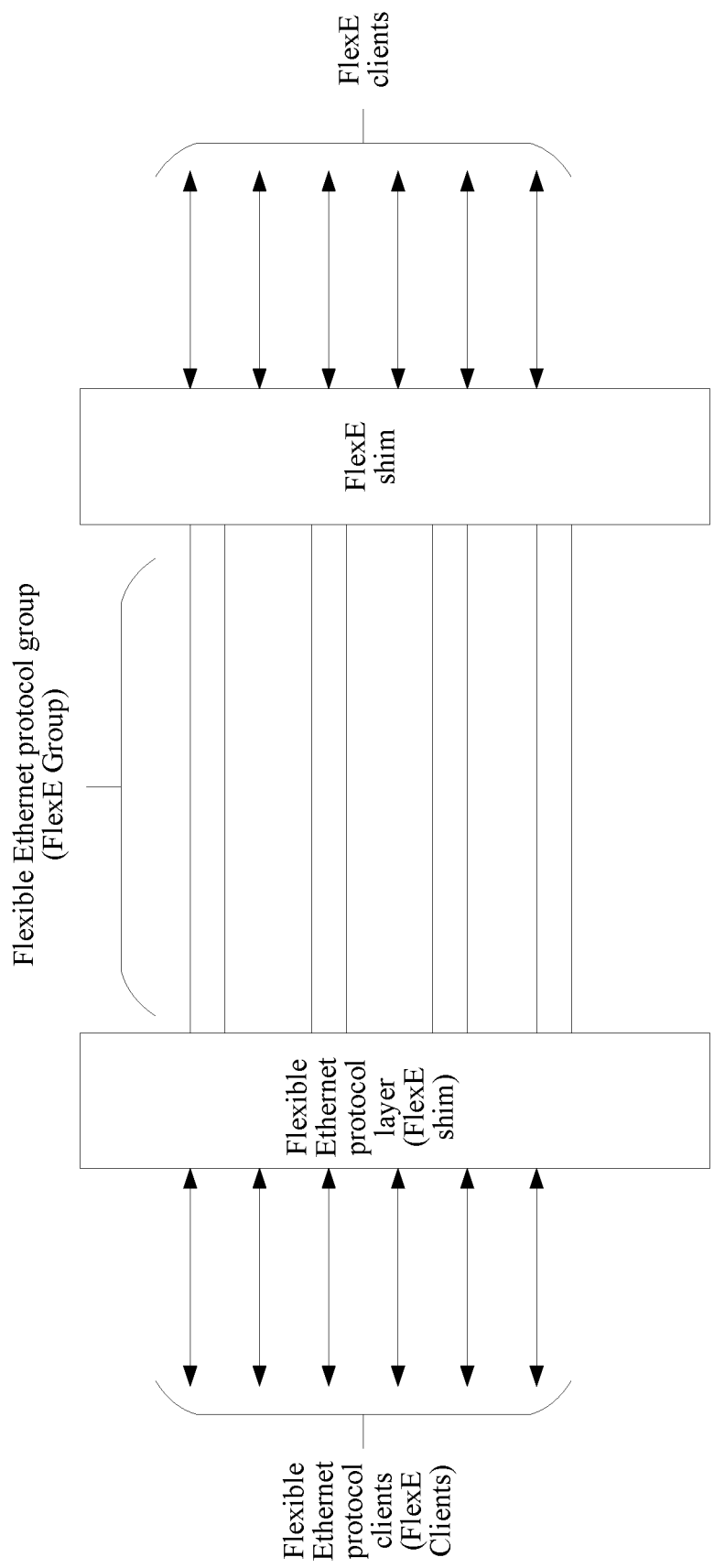
FIG. 1 is a schematic diagram of a communications system based on the flexible Ethernet protocol.
Figure 2:
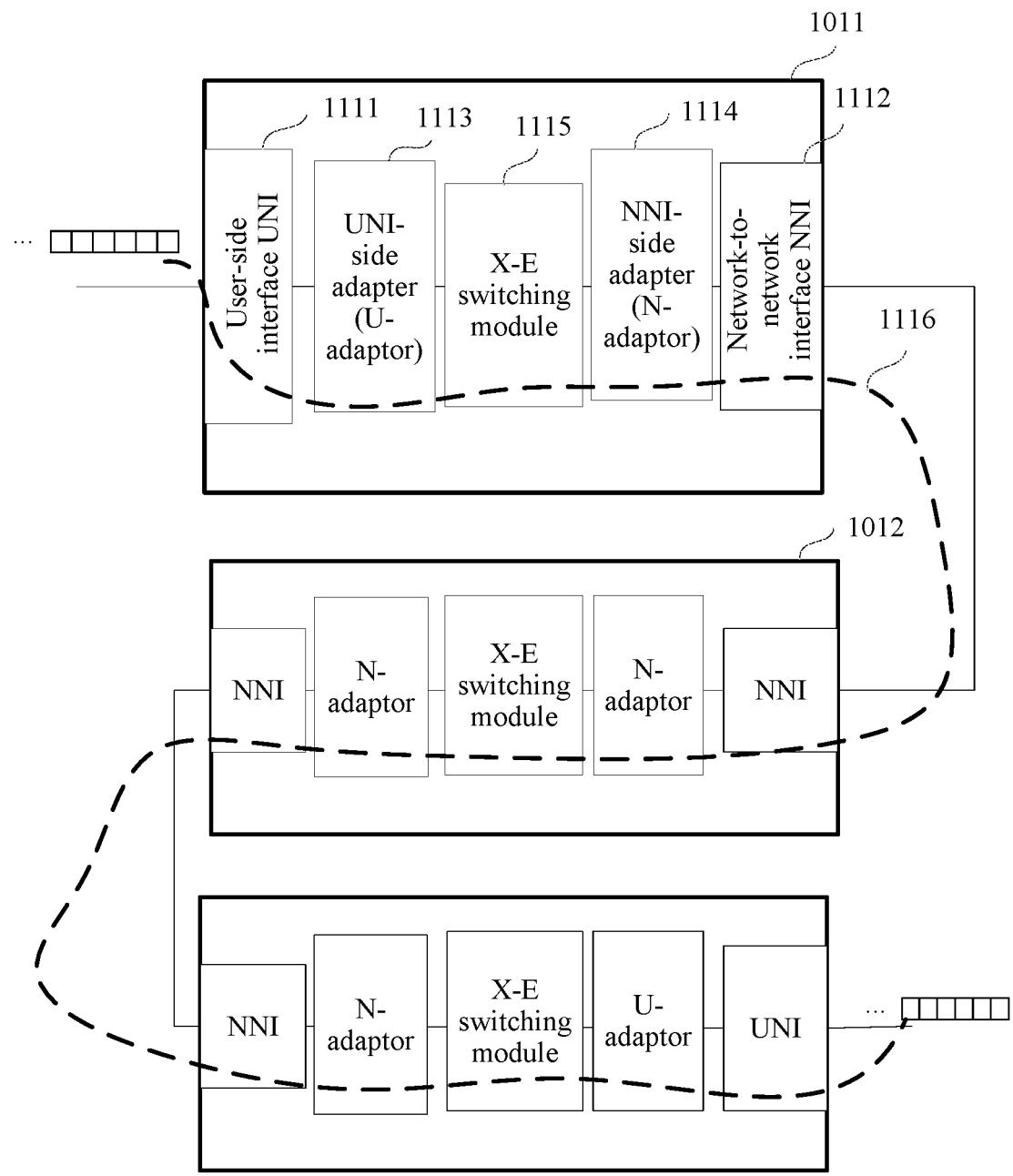
FIG. 2 is a schematic architecture diagram of an X-E communications system.
Figure 3:
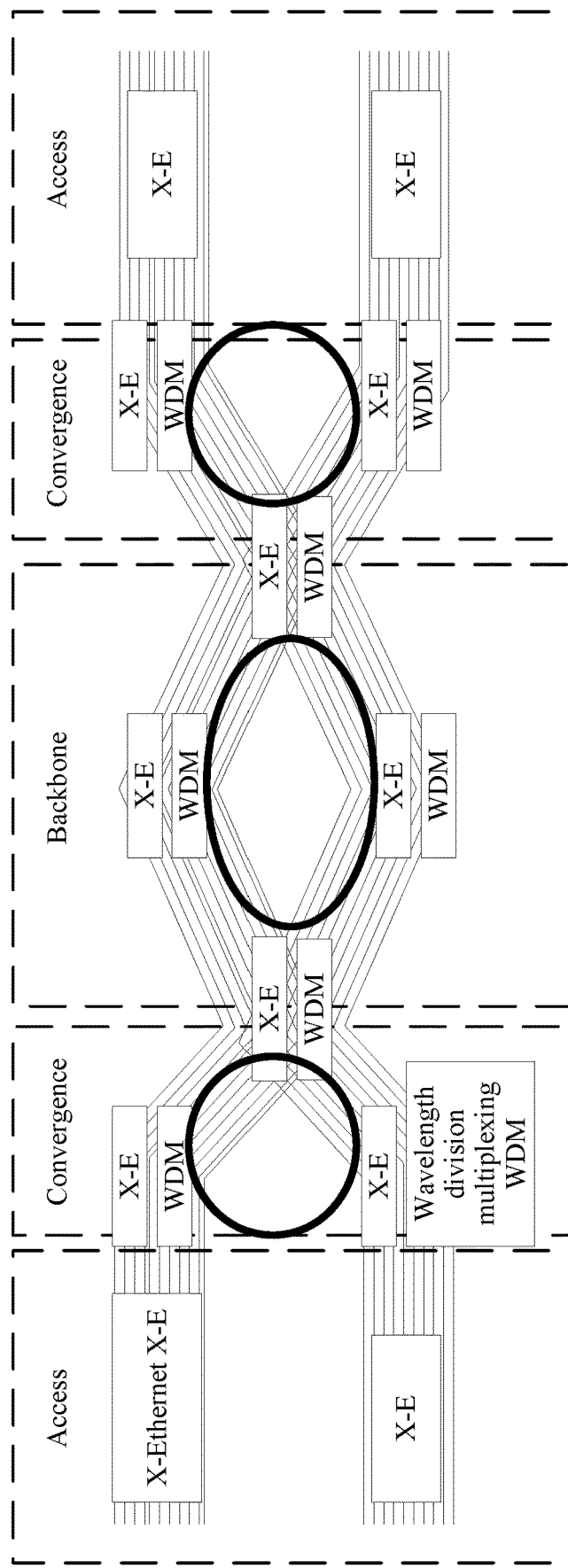
FIG. 3 is a schematic diagram of end-to-end communication.
Figure 6:
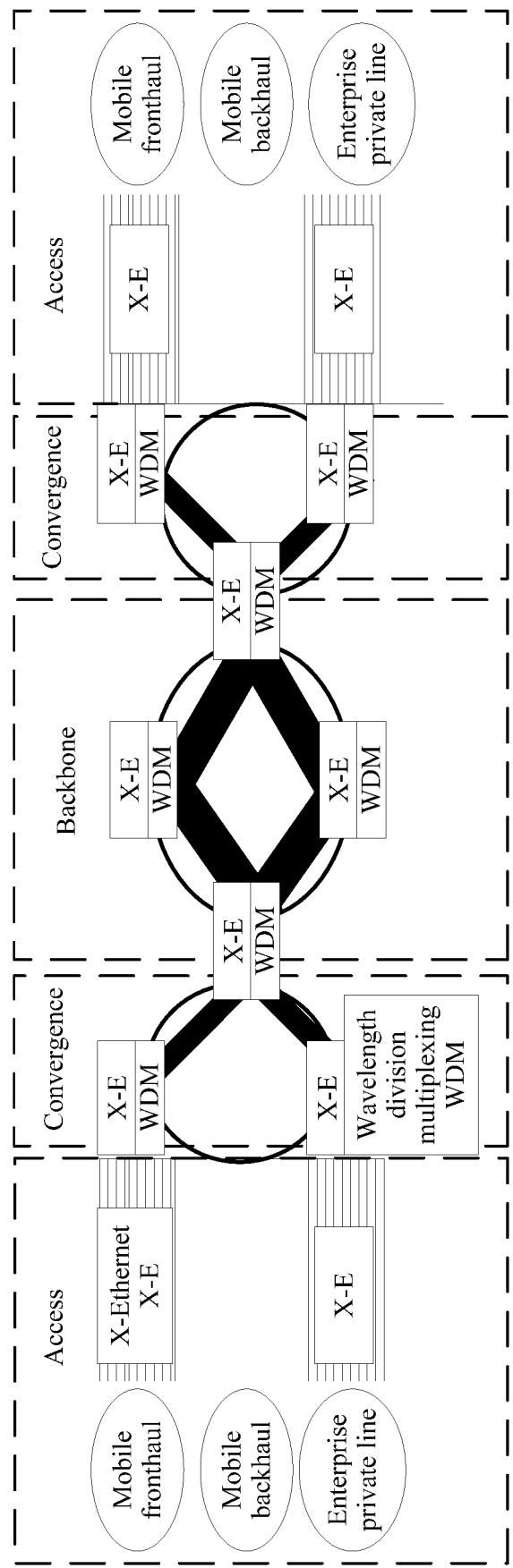
FIG. 6 is a schematic architecture diagram of a network system according to an embodiment of this application.

For example, FIG. 6 is a schematic architecture diagram of a network system according to an embodiment of this application. In an X-Ethernet, cross-connections may be performed based on common data unit sequence streams on a conventional Ethernet interface, a fiber channel interface of a fiber channel (FC) technology, a common public radio interface (CPRI), a synchronous digital hierarchy SDH/SONET, an optical transport network OTN, and a FlexE interface, and an end-to-end networking technology independent of a specific protocol is provided, where switched objects are the common data unit sequence streams. Rate adaptation from a data unit sequence stream to a FlexE slot or a corresponding physical interface may be implemented through accompanying addition or deletion of idle code blocks. Specifically, a cross-connection may be performed based on a 64B/66B code block stream, or a cross-connection may be performed based on a common data unit stream after a 64B/66B code block stream is decoded. As shown in FIG. 6, a plurality of types of data may be accessed on access sides of two ends, for example, a mobile fronthaul CPRI, a mobile backhaul Ethernet, an enterprise SDH, or an Ethernet private line. In the example shown in FIG. 6, after this embodiment of this application is used, a convergence node (convergence shown in FIG. 6) of the X-E may multiplex Q service code streams into one code stream, to reduce a quantity of cross-connections that need to be processed by the convergence node and a backbone node. As can be seen from comparison between FIG. 3 and FIG. 6, applying the solution provided by this embodiment of this application can effectively reduce a quantity of cross-connections processed on a data plane by a core node (for example, the convergence node and the backbone node shown in FIG. 6) and reduce pressure of the core node. In this embodiment of this application, * denotes multiplication.

Figure 7:
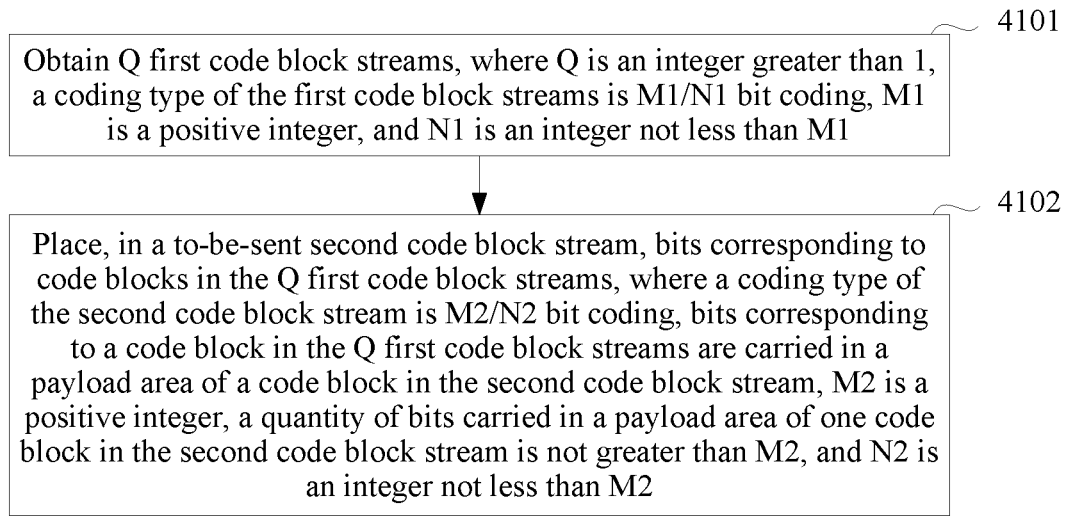
FIG. 7 is a schematic flowchart of a data transmission method according to an embodiment of this application.

Based on the foregoing descriptions, an embodiment of this application provides a data transmission method. On a multiplexing side, the data transmission method may be performed by the communications device 3105 and the communications device 3107 in FIG. 4 and FIG. 5. On a demultiplexing side, the data transmission method may be performed by the communications device 3109 in FIG. 4 and the communications device 3205 in FIG. 5. In this embodiment of this application, the communications device on the multiplexing side may also be referred to as a first communications device, and the communications device on the demultiplexing side is referred to as a second communications device. Optionally, a communications device may have a multiplexing capability, and may also have a demultiplexing capability. To be specific, a same communications device may be a first communications device on the multiplexing side in a data transmission link, and may also be a second communications device on the demultiplexing side in another data transmission link process. For example, FIG. 7 is a schematic flowchart of a data transmission method according to an embodiment of this application. As shown in FIG. 7, the method includes the following steps.

Step 4101: A first communications device obtains Q first code block streams, where Q is an integer greater than 1, a coding type of the first code block streams is M1/N1 bit coding, M1 is a positive integer, and N1 is an integer not less than M1.

Step 4102: The first communications device places, in a to-be-sent second code block stream, bits corresponding to code blocks in the Q first code block streams, where a coding type of the second code block stream is M2/N2 bit coding, bits corresponding to a code block in the Q first code block streams are carried in a payload area of a code block in the second code block stream, M2 is a positive integer, a quantity of bits carried in a payload area of one code block in the second code block stream is not greater than M2, and N2 is an integer not less than M2. The placing, in a to-be-sent second code block stream, bits corresponding to code blocks in the Q first code block streams may also be described as multiplexing (or interleaving, which may also be expressed as interleaving), in the to-be-sent second code block stream, the bits corresponding to the code blocks in the Q first code block streams.

In this embodiment of this application, optionally, coding modes of the first code block stream and the second code block stream may be the same. In other words, M1 may be the same as or different from M2, and N1 may be the same as or different from N2. For example, the coding mode of the first code block stream is an 8B/10B coding mode, and the coding mode of the second code block stream is a 64B/66B coding mode; or the coding mode of the first code block stream is a 64B/65B coding mode, and the coding mode of the second code block stream is a 64B/66B coding mode.

Optionally, when the solution provided by this embodiment of this application is applied to FIG. 4, at least one first communications device is included between the first communications device 3107 and the second communications device 3109. When receiving the code block stream 3207, the first communications device does not demultiplex the code block stream 3207. To be specific, the second code block stream traverses at least one intermediate node to reach the second communications device on the demultiplexing side, and the intermediate node does not need to perform demultiplexing on the second code block stream. When this embodiment of this application is applied to the X-E, the process may also be described as follows: The second code block stream sequentially enters a bearer pipe including a combination of slots in a flexible Ethernet interface group of a current node and a next node for transmission, and traverses the network to reach the second communications device on the demultiplexing side. Optionally, an intermediate node may perform multiplexing again on the second code block stream and another code block stream. This is not limited in this embodiment of this application. In the solution provided by this embodiment of this application, multiplexing and demultiplexing are performed on the code block streams based on a code block granularity. In this way, according to the solution provided in step 4101 and step 4102, multiplexing can be implemented on a plurality of first code block streams to multiplex the plurality of first code block streams into one second code block stream for transmission. Therefore, a quantity of cross-connections that need to be processed by the intermediate node can be reduced, and pressure in network management, operation, and maintenance can also be reduced. Optionally, the intermediate node in this embodiment of this application is a communications device between the first communications device on the multiplexing side and the second communications device on the demultiplexing side on the transmission path.

In an optional embodiment, the foregoing step 4102 may be sequentially placing, in a payload area of a code block in the second code block stream, a synchronization header area and a non-synchronization header area of one code block in the Q first code block streams. To be specific, information carried in the synchronization header area and information carried in the non-synchronization header area of the code block are sequentially placed in the payload area of the code block in the second code block stream based on an order of the synchronization header area and the non-synchronization header area in the first code block stream.

This embodiment of this application further provides an optional embodiment: All bits corresponding to a synchronization header area and a non-synchronization header area of one code block in the Q first code block streams are correspondingly placed in payload areas of at least two code blocks in the second code block stream. For example, if coding modes of each of the Q first code block streams and the second code block stream are 64B/66B coding, a total quantity of bits of one code block in the first code block stream is 66 bits, and a total quantity of bits of one code block in the second code block stream is 66 bits, but a payload area of one code block in the second code block stream is 64 bits. Therefore, 66 bits of one code block in the first code block stream need to be placed in payload areas of at least two code blocks in the second code block stream.

Alternatively, the first code block stream in this embodiment of this application may be a multiplexed code block stream. For example, in FIG. 4, the first communications device 3105 multiplexes the code block stream 3201, the code block stream 3202, and the code block stream 3203, and then outputs the multiplexed code block stream 3205. The first communications device 3107 may multiplex the code block stream 3204, the code block stream 3206, and the multiplexed code block stream 3205 again. To be specific, a nested application is supported in this embodiment of this application. In this embodiment of this application, for bearer pipes of code block streams on an input side and an output side of the first communications device, if a pipe of a code block stream before being multiplexed for transmission is referred to as a low order pipe, and a pipe of a code block stream after being multiplexed for transmission is referred to as a high order pipe, for example, if pipes carrying the code block stream 3201, the code block stream 3202, and the code block stream 3203 in FIG. 4 are referred to as low order pipes, and a pipe 3207 carrying the multiplexed code block stream 3205 is referred to as a high order pipe, in this embodiment of this application, code blocks in the low order pipes may be loaded into the high order pipe, and code blocks in the high order pipe may be loaded into a higher order pipe, so that nested multiplexing from the high order pipe to the higher order pipe is implemented.

The first communications device in this embodiment of this application may include a plurality of interfaces. The interfaces may be classified into interfaces on the input side and interfaces on the output side based on data transmission directions. The first communications device includes a plurality of interfaces on the input side and one or more interfaces on the output side. Optionally, the interfaces of the first communications device may be preconfigured, and a plurality of code block streams received by some or all interfaces on the input side are multiplexed into one of a plurality of code block streams on an interface on the output side. For example, if the interfaces on the input side of the first communications device include an interface 1, an interface 2, and an interface 3, and the output interfaces include an interface 4 and an interface 5, it may be configured that Q1 code block streams received by the interface 1 and Q2 code block streams received by the interface 2 are multiplexed into one code block stream for outputting by using the interface 4, and Q3 code block streams received by the interface 3 are multiplexed into one code block stream for outputting by using the interface 5. Alternatively, Q4 code block streams in Q1, Q2, and Q3 code block streams may be multiplexed into one code block stream for outputting by using the interface 4, and Q5 code block streams in Q1, Q2, and Q3 code block streams are multiplexed into one code block stream for outputting by using the interface 5. Optionally, configuration information for multiplexing between the interfaces of the first communications device may be adjusted periodically or aperiodically, or may be configured statistically and fixedly.

The following describes any one of the Q first code block streams and the second code block stream in this embodiment of this application, and one code block in the Q first code block streams and the second code block stream. In the following descriptions, unless a first code block stream and the second code block stream are particularly mentioned, a mentioned code block stream is any one of the Q first code block streams and the second code block stream. In the following descriptions, unless a code block in a first code block stream and a code block in the second code block stream are particularly mentioned, a mentioned code block is any code block in the Q first code block streams and the second code block stream.

The code block stream (for example, the first code block stream and the second code block stream) defined in this embodiment of this application may be a data stream using a code block as a unit. In this embodiment of this application, the code block (for example, the code block in the first code block stream and the code block in the second code block stream) may be expressed as a bit block, or a block. In this embodiment of this application, a preset quantity of bits in a bit stream (the bit stream may be a bit stream after being encoded or before being encoded) may be referred to as one code block (the code block may also be referred to as a bit group or a bit block). For example, in this embodiment of this application, one bit may be referred to as one code block. For another example, two bits may be referred to as one code block. In another optional embodiment, the code block defined in this embodiment of this application may be a code block obtained after a bit stream is encoded by using a coding type. Some coding modes are defined in this embodiment of this application, for example, M1/N1 bit coding, M2/N2 bit coding, and M3/N3 bit coding. In this embodiment of this application, the coding modes are collectively referred to as an M/N bit coding mode. To be specific, in this embodiment of this application, descriptions about the M/N bit coding mode is applicable to any one or more of M1/N1 bit coding, M2/N2 bit coding, and M3/N3 bit coding. To be specific, when descriptions about M are applicable to M1, descriptions about N are correspondingly applicable to N1; when descriptions about M are applicable to M2, descriptions about N are correspondingly applicable to N2; and when descriptions about M are applicable to M3, descriptions about N are correspondingly applicable to N2.

In an optional embodiment, M may be equal to N. In this way, if one code block includes a synchronization header area and a non-synchronization header area, it may be understood that no bit is carried in the synchronization header area. Alternatively, it may be understood that a preset quantity of bits are referred to as one code block. A boundary of a code block is determined by other technical means.

Figure 8:
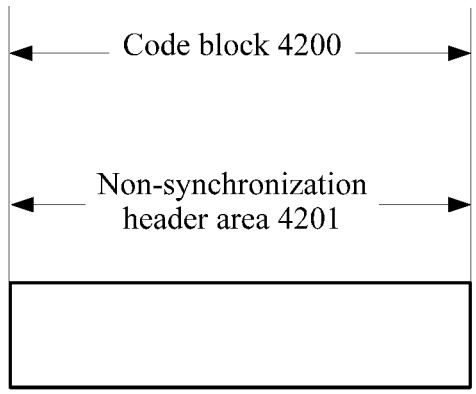
FIG. 8 is a schematic structural diagram of a code block according to an embodiment of this application.

In another optional embodiment, N may be greater than M. However, there is no definite synchronization header. For example, for a code block obtained after it is encoded by using 8B/10B coding and direct current equalization is implemented, there are 1024 8B/10B code block samples of a 10-bit information length, far more than 256 code block samples required by an 8-bit information length. 8B/10B code block synchronization may be implemented by using a predetermined code block sample, to identify a boundary of the 8B/10B code block. The 8B/10B code block includes only a non-synchronization header area. For example, FIG. 8 is a schematic structural diagram of a code block according to an embodiment of this application. As shown in FIG. 8, no bit is carried in a synchronization header area included in a code block 4200, and all bits included in the code block 4200 are bits carried in a non-synchronization header area 4201.

Figure 9:
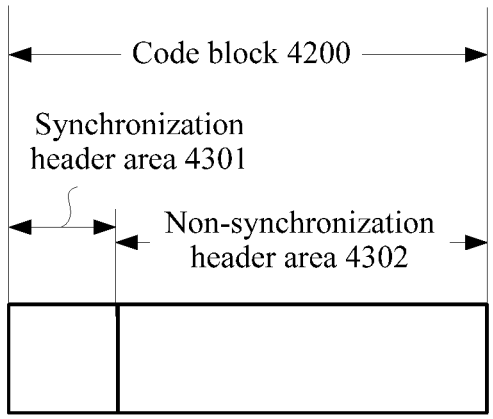
FIG. 9 is a schematic structural diagram of another code block according to an embodiment of this application.

In an optional embodiment in which N may be greater than M, for example, M/N bit coding may also be 64B/66B coding (64B/66B coding may also be expressed as 64B/66B bit coding) defined in 802.3, and as defined in the standard, the code block may include a synchronization header area and a non-synchronization header area. In this embodiment of this application, a code block obtained after it is encoded by using M/N bit coding may be a code block whose non-synchronization header area includes M bits and a total quantity of bits of the encoded code block is N bits; and the code block obtained after it is encoded by using M/N bit coding may also be described as a code block including M bits of the non-synchronization header area and several bits of the synchronization header area. For example, FIG. 9 is a schematic structural diagram of another code block according to an embodiment of this application. As shown in FIG. 9, a code block 4200 includes a synchronization header area 4301 and a non-synchronization header area 4302. Optionally, a quantity of bits carried in the non-synchronization header area 4302 is M, and a quantity of bits carried in the synchronization header area 4301 is (N−M). Information carried in the synchronization header area 4301 in this embodiment of this application may be used to indicate a type of the code block, and the type of the code block may include a control type, a data type, some other types, or the like.

In an actual application, a code block stream obtained after it is encoded by using M/N bit coding may be transferred on an Ethernet physical layer link. M/N bit coding may be 8B/10B coding used in 1G Ethernet, that is, a code block stream (the code block stream may also be referred to as a block stream) of an 8B/10B coding type is transferred on a 1GE physical layer link; or M/N bit coding may be 64B/66B coding used in 10GE, 40GE and/or 100GE, that is, a 64B/66B code block stream is transferred on a 10GE, 40GE, and/or 100GE physical layer link. With development of Ethernet technologies in the future, other coding and decoding may be available. M/N bit coding in this embodiment of this application may also be some coding types available in the future. For example, 128B/130B coding or 256B/257B coding may be available. In an actual application, a code block may be a code block (which may also be referred to as an 8B/10B code block) obtained after being encoded at an Ethernet physical coding sublayer (PCS) sublayer as specified in IEEE 802.3 and obtained by using 8B/10B coding, a code block (which may also be referred to as a 64B/66B code block) obtained by using 64B/66B coding, or the like. For another example, a code block in this embodiment of this application may be a code block (which may be referred to as a 256B/257B code block) obtained by using 256B/257B coding (e.g., transcoding) at an Ethernet forward error correction (FEC) sublayer in 802.3. For another example, a code block in this embodiment of this application may be a code block (which may also be referred to as a 64B/65B code block) obtained by using a 64B/65B code block that is obtained based on 64B/66B transcoding in ITU-T G709, or a 512B/514B code block. For another example, the code block in this embodiment of this application may be a code block (which may also be referred to as a 64B/67B code block) obtained by using 64B/67B coding in an Interlaken bus specification.

Figure 10:
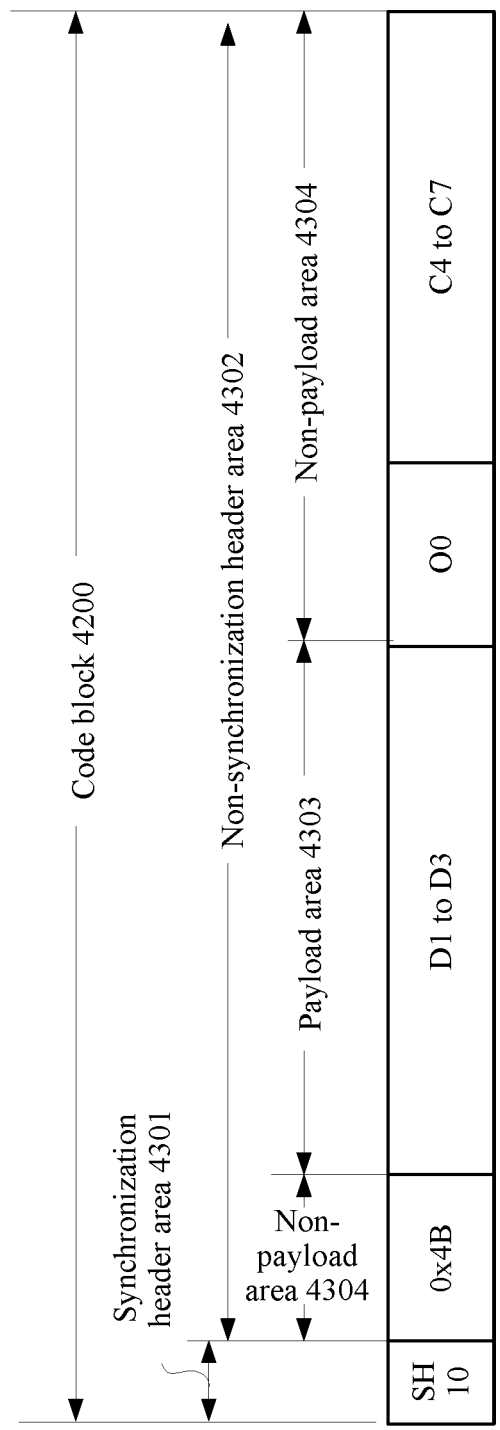
FIG. 10 is a schematic structural diagram of a code block according to an embodiment of this application.

Structural forms of some code blocks, for example, an S code block, a data code block, a T code block, and an idle code block, are specified in prior systems. The code blocks (for example, the code block in the first code block stream and the code block in the second code block stream) in this embodiment of this application may be the code blocks specified in the prior systems. For example, FIG. 10 is a schematic structural diagram of an O code block whose type field is 0x4B according to an embodiment of this application. As shown in FIG. 10, a code block 4200 in this embodiment of this application is an O code block, and information carried in a synchronization header area 4301 included in the O code block 4200 is "SH10", where "SH10" indicates that the type of the code block 4200 is the control type. A non-synchronization header area 4302 includes a payload area 4303 and a non-payload area 4304, where the non-payload area 4304 may be used to carry type fields "0x4B" and "O0" and reserved fields "C4 to C7", and the reserved fields "C4 to C7" may be all filled with "0x00". Optionally, "O0" may be filled with a feature command word in prior approaches such as "0x0", "0xF", or "0x5", or a feature command word not used in prior approaches such as "0xA", "0x9", or "0x3", to distinguish from prior approaches. Content added to the "O0" field may be used to indicate some information. Optionally, a head code block in this embodiment of this application may be a code block whose characters include S, or may be a new code block such as a newly defined O code block, for example, an O code block whose type field is 0x4B shown in FIG. 10. For another example, a head code block may be an S code block whose type field is 0x33 or an S code block whose type field is 0x66, 64B/66B coding as defined in the standard. For some high-speed Ethernets, for example, 100GE/200GE/400GE, an S code block is only one type of code block, its type field is 0x78, and the S code block includes a data payload of seven bytes. However, for some low-speed Ethernets, for example, 10GE/25GE, S code blocks may include code blocks whose type fields are 0x78, 0x33, and 0x66, or may include other code blocks whose characters include an S character, where an S code block may include a data payload of four bytes. In an optional embodiment, a conventional Ethernet S code is just obtained by encoding a 7-byte preamble and a 1-byte start of frame delimiter (SFD). Therefore, in a possible bit pattern of an S code block, a synchronization header area 4301 is "10", a type field in a non-payload area 4304 is "0x78", a subsequent payload area 4303 is all filled with "0x55", and in a non-payload area 4304 after the payload area 4303, a last byte is filled with "0xD5" and other bytes are all filled with "0x55".

Figure 11:
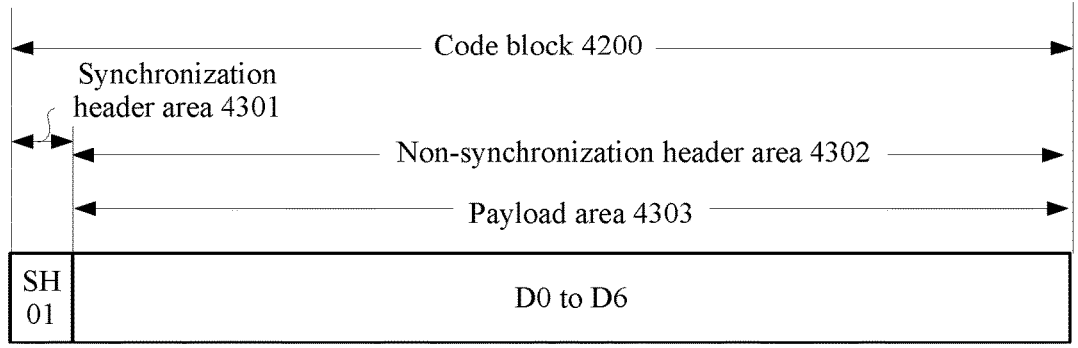
FIG. 11 is a schematic structural diagram of a data code block according to an embodiment of this application.

A code block in this embodiment of this application may be a data code block. For example, FIG. 11 is a schematic structural diagram of a data code block according to an embodiment of this application. As shown in FIG. 11, a code block 4200 in this embodiment of this application is a data code block, and information carried in a synchronization header area 4301 included in the code block 4200 is "SH01", where "SH01" indicates that a type of the code block 4200 is a data type. A non-synchronization header area 4302 includes a payload area 4303. The entire non-synchronization header area of the data code block is a payload area, for example, the payload area shown by D0 to D7 in the figure.

Figure 12:
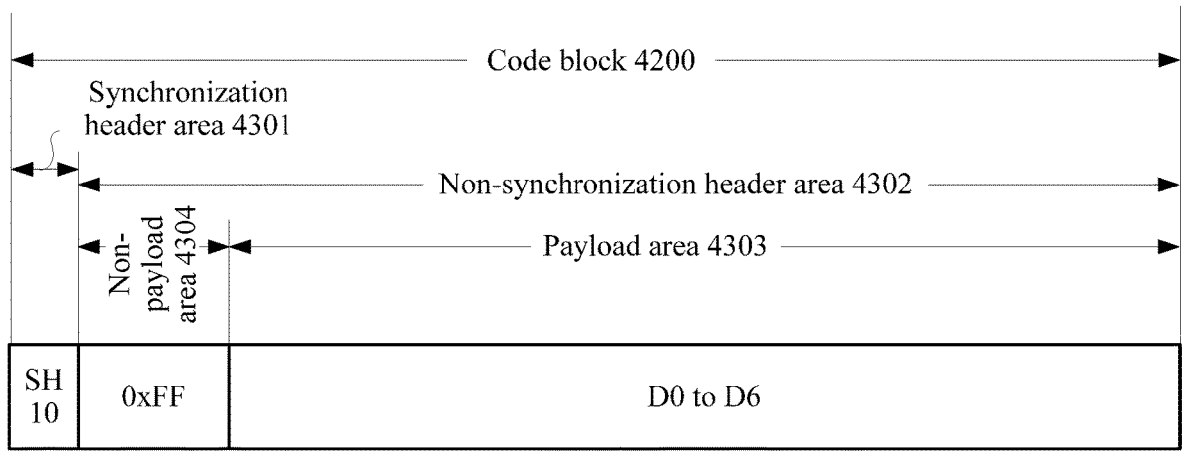
FIG. 12 is a schematic structural diagram of a T7 code block according to an embodiment of this application.

A code block in this embodiment of this application may be a T code block. The T code block may be a code block whose characters include T. The T code block may include any code block in T0 to T7, for example, a T0 code block whose type field is 0x87, a T1 code block whose type field is 0x99, or a T7 code block whose type field is 0xFF. For example, FIG. 12 is a schematic structural diagram of a T7 code block according to an embodiment of this application. As shown in FIG. 12, a code block 4200 in this embodiment of this application is a T7 code block, and information carried in a synchronization header area 4301 included in the code block 4200 is "SH10", where "SH10" indicates that a type of the code block 4200 is a control type. A non-synchronization header area 4302 includes a payload area 4303 and a non-payload area 4304. The non-payload area 4304 may be used to carry a type field "0xFF". Type fields of T0 to T7 code blocks are 0x87, 0x99, 0xAA, 0xB4, 0xCC, 0xD2, 0xE1, and 0xFF respectively, and the T0 to T7 code blocks are all applicable to an Ethernet interface using 64B/66B coding. It should be noted that, each of the T1 to T7 code blocks includes a payload area of one to seven bytes. Optionally, the payload area of the T code block may be used to carry bits corresponding to a code block obtained from a first code block stream, or may not be used to carry bits corresponding to a code block obtained from a first code block stream, for example, may be filled with all 0s, or may be used to carry other indication information. C1 to C7 in the T0 to T6 code blocks may be processed based on a conventional Ethernet technology. To be specific, seven encoded idle control bytes (C1 to C7 bytes) after a T character are all 7-bit 0x00. For example, for a T code whose type is 0xFF, D0 to D6 are all filled with 8-bit "0x00", and are reserved and not used.

Figure 13:
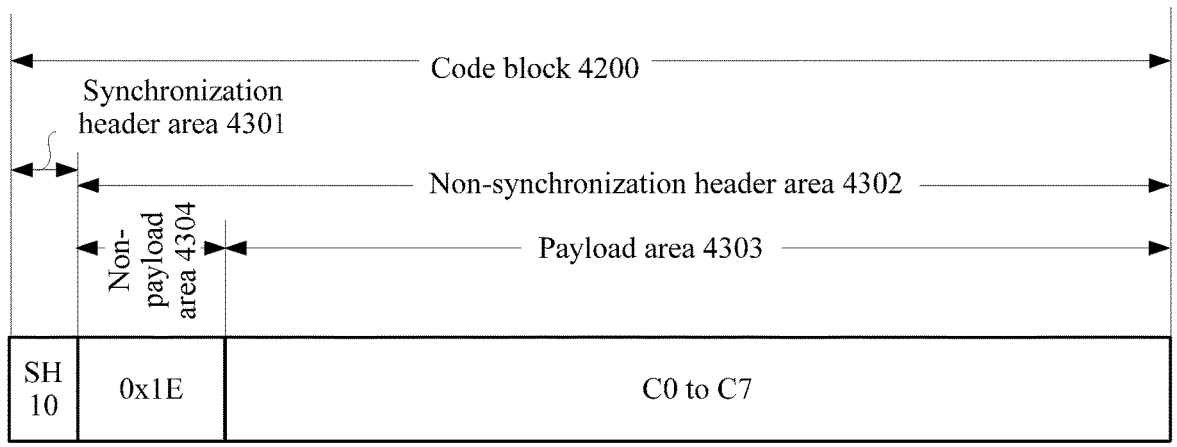
FIG. 13 is a schematic structural diagram of an idle code block according to an embodiment of this application.

A code block in this embodiment of this application may be an idle code block. For example, FIG. 13 is a schematic structural diagram of an idle code block according to an embodiment of this application. As shown in FIG. 13, a code block 4200 in this embodiment of this application is an idle code block, and information carried in a synchronization header area 4301 included in the code block 4200 is "SH10", where "SH10" indicates that a type of the code block 4200 is a control type. A non-synchronization header area 4302 is used to carry a type field "0x1E", and content carried in remaining fields "C0 to C7" of the non-synchronization header area 4302 is "0x00". The second code block stream in this embodiment of this application includes at least one data unit, and an idle code block may be added into a data unit, or may be added between data units.

Figure 14:
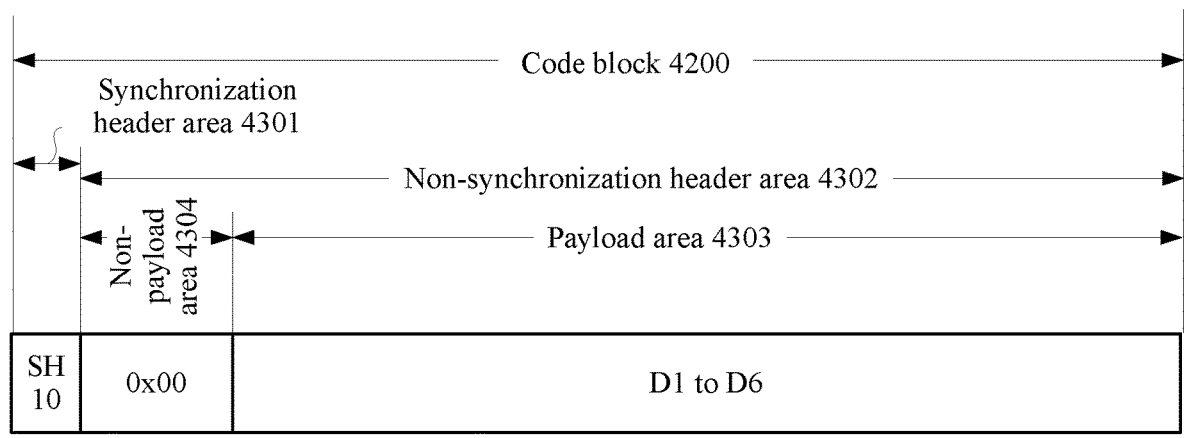
FIG. 14 is a schematic structural diagram of another code block according to an embodiment of this application.

Optionally, some indication information may be carried in the second code block stream (the indication information mentioned in this embodiment of this application may be identifier indication information, slot allocation indication information, multiplexing indication information, or the like mentioned in subsequent content), so that an egress side performs demultiplexing in a manner consistent with that on an ingress side, or when the multiplexing and demultiplexing sides have agreed upon multiplexing and demultiplexing relationships, the indication information is used to verify the multiplexing and demultiplexing relationships. A code block carrying the indication information may be referred to as an operations, administration, and maintenance (OAM) code block. Optionally, the OAM code block requires a specific type field to distinguish from an idle code block. In this embodiment of this application, for example, a reserved block type whose type field is 0x00 is used as an OAM code block type to distinguish from other code blocks. For example, FIG. 14 is a schematic structural diagram of another code block according to an embodiment of this application. As shown in FIG. 14, information carried in a synchronization header area 4301 included in a code block 4200 is "SH10", where "SH10" indicates that a type of the code block 4200 is a control type. A non-synchronization header area 4302 includes a payload area 4303 and a non-payload area 4304, where the non-payload area may be used to carry a type field "0x00". An OAM code block may be the code block shown in FIG. 14. A field after "0x00" in FIG. 14 is filled with "0x00", and the field may be referred to as a type field of the OAM code block, or may be expressed as OAMType. For example, if there are four slots in total, four continuous preset fields of the OAM code block carry identifiers of first code block streams corresponding to the four slots, so that a correspondence between the slots and the first code block streams is sent to a peer end. The four preset fields may be last four fields of the OAM code block, and remaining fields may be reserved fields, for example, may be filled with 0. Optionally, the OAM code block may replace an idle code block in a data unit in the second code block stream, or may be inserted between data units.

Based on the foregoing content, this embodiment of this application provides a possible structural form of the second code block stream. A person skilled in the art may know that, a structural form of a first code block stream may be a structural form defined in the prior approaches, or may be similar to or the same as the structural form of the second code block stream in this embodiment of this application. This is not limited in this embodiment of this application herein. The following describes several possible structural forms of the second code block stream. Optionally, the second code block stream corresponds to at least one data unit. A data unit may include a plurality of structural forms. For example, in a first structural form, one data unit corresponding to the second code block stream may include a head code block and at least one data code block. A second structural form considers compatibility with and reuse of an existing Ethernet frame delimitation format, that is, retaining a typical Ethernet preamble, a start code block (the start code block is also referred to as an S code block) corresponding to the Ethernet frame delimitation format, a frame terminator, an idle byte in a gap, a termination code block (the termination code block may be a T code block) corresponding to the Ethernet frame delimitation format, and an idle code block. Optionally, one data unit corresponding to the second code block stream may include a head code block, at least one data code block, and a tail code block. In a third structural form, one data unit corresponding to the second code block stream may include at least one data code block and a tail code block. The head code block and the tail code block may be used to carry some information, and may be further used to delimit a data unit. For example, the head code block and the tail code block are used to delimit a data unit. Further, in another possible structural form, one data unit corresponding to the second code block stream may include at least one data code block. For example, a quantity of data code blocks included in one data unit may be set. In the foregoing step 4102, bits corresponding to a code block in the Q first code block streams are carried in a payload area of any one or more of a head code block, a tail code block, and a data code block in the second code block stream. For example, bits corresponding to a code block in the Q first code block streams are carried in payload areas of the head code block and the data code block in the second code block stream.

In an optional embodiment, in the plurality of structural forms in the foregoing example, a data code block in one data unit in the second code block stream may include at least one type-1 data code block, bits corresponding to a code block in the Q first code block streams are carried in a payload area of a type-1 data code block in the at least one type-1 data code block in the second code block stream, and a quantity of bits carried in a payload area of one type-1 data code block in the second code block stream is M2. In another optional embodiment, in the plurality of structural forms in the foregoing example, a data code block in one data unit in the second code block stream may include at least one type-1 data code block and at least one type-2 data code block. To be specific, in this embodiment, all bits corresponding to a code block in a first code block stream are carried in a type-1 data code block, but a head code block, a tail code block, and a type-2 data code block may be used to carry other information (for example, any one or more of subsequent slot allocation indication information, identifier indication information, and multiplexing indication information). In other words, bits corresponding to a code block corresponding to each of all slots that are obtained through division are carried in a payload area of a type-1 data code block. A quantity of type-2 data code blocks may be 0 or may not be 0.

Optionally, in this embodiment of this application, a head code block and a tail code block in one data unit in the second code block stream may be some newly set code blocks that have fixed formats. The head code block and the tail code block may be used to delimit the data unit, or may carry some information. Optionally, for compatibility with a technology, optionally, the head code block may be an O code block, and the O code block may be a code block whose type field is 0x4B, as shown in FIG. 10. Optionally, the head code block may also be another S code block that is defined in prior approaches and whose characters include an S character. For example, the head code block may be an S code block whose type field is 0x33 or an S code block whose type field is 0x78. Further, optionally, when the head code block is an O code block, information may be added to a preset field of the O code block, to distinguish from a form in the prior approaches. The preset field may be a feature command word that is not used such as a feature command word O=0xA or 0x9 or 0x3 in the O code block. Certainly, a code block of a 0x00 type that is reserved and not used up to now may be used. As shown in FIG. 14, the head code block may include a synchronization header area and a non-synchronization header area, where the non-synchronization header area includes a non-payload area and a payload area.

In another optional embodiment, the tail code block may be a T code block. The T code block may be a T7 code block whose type field is 0xFF, as shown in FIG. 12, or may be another T code block defined in another prior approach, for example, any one of T0 to T6 code blocks. A data unit in the second code block stream is encapsulated by using an S code and a T code, for compatibility with the prior approach. The second code block stream carrying a plurality of first code block streams can traverse deployed X-Ethernet and FlexE client switching nodes that currently support flat networking.

In addition, one data unit in the second code block stream may further optionally include some idle code blocks, where positions of the idle code blocks in the data unit may be preconfigured, or may be random.

Optionally, some other code blocks, for example, control code blocks, or data code blocks, or other code block types of code blocks, may also be configured between adjacent data units in the second code block stream. For example, any one or more of some idle code blocks, S code blocks, and the code block shown in FIG. 14 are configured between adjacent data units in the second code block stream. The adjacent data units in the second code block stream may be separated by one or more idle code blocks. A quantity of idle code blocks between the adjacent data units in the second code block stream may be a variable, and may be adjusted based on a specific application scenario. In an optional embodiment, at least two groups of adjacent data units may exist in the second code block stream (each group of adjacent data units includes two adjacent data units), and quantities of idle code blocks between the two groups of adjacent data units are not equal. Optionally, idle code blocks between adjacent data units in the second code block stream are appropriately increased or reduced, that is, adaptively increased or reduced, to implement rate adaptation (or implement frequency adaptation in this embodiment of this application). For example, if a bandwidth of a pipe carrying the second code block stream is relatively low, idle code blocks between data units in the second code block stream may be appropriately reduced. In a possible embodiment, idle code blocks between adjacent data units are reduced to zero, that is, there is no idle code block between two adjacent data units. For another example, if a bandwidth of a pipe carrying the second code block stream is relatively high, idle code blocks between data units in the second code block stream may be appropriately increased. In another possible embodiment, an idle code block may be inserted in any position in the second code block stream to implement rate adaptation, but corresponding to a case in which a bandwidth/rate difference is relatively small, it may be recommended that an idle code block should be inserted between two data units. For example, a quantity of idle code blocks between data units may be increased from 1 to 2 or more.

In an example of adding an idle code block between adjacent data units in the second code block stream, for example, one idle code block may be added between adjacent data units averagely. In this case, distribution of idle code blocks may be relatively even, and a sufficient margin of idle code blocks (higher than 200 parts per million (ppm), to support an Ethernet link rate difference +/−100 ppm in an extreme case) may be reserved between data units in the second code block stream. In this case, there are an upper limit for a quantity of code blocks in one data unit in the second code block stream and an upper limit for a total quantity of bits in a payload area included in one data unit. It is recommended that a maximum value should be set on a basis of the upper limit.

Optionally, several idle code blocks are added between data units in the second code block stream, to support subsequent addition or deletion of idle code blocks in the second code block stream, so that the second code block stream is adapted to a rate difference of a pipe. For example, the rate difference of the pipe may be 100 ppm. Therefore, when a bandwidth of the pipe carrying the second code block stream is relatively low, rate adaptation can be implemented by deleting an idle code block between data units in the second code block stream.

In an optional embodiment, one data unit in the second code block stream includes one head code block, 33 data code blocks, and one idle code block. A proportion of the idle code block is $1/35$, which is far greater than 100 ppm (100 parts per million). Therefore, optionally, some idle code blocks may be further replaced with operations, administration, and maintenance (OAM) code blocks, so that the second code block stream carries some OAM information. A structural form of an OAM code block may be the structural form of the code block shown in FIG. 14. This type of code block in this embodiment of this application may be used to carry indication information (the indication information may be any one or more of slot allocation indication information, multiplexing indication information, and identifier indication information).

In this embodiment of this application, bits corresponding to code blocks in the first code block streams are correspondingly carried in the second code block stream. In an optional embodiment, the first communications device on the multiplexing side and the second communications device on the demultiplexing side may reach an agreement, so that the second communications device on the demultiplexing side demultiplexes the Q first code block streams from the second code block stream based on the agreement. In another optional embodiment, for one code block in the Q first code block streams carried in the second code block stream, the second code block stream further includes identifier indication information corresponding to the code block, where the identifier indication information is used to indicate a first code block stream corresponding to the code block. In this way, the identifier indication information is sent to the second communications device on the demultiplexing side. Therefore, the demultiplexing side is enabled to determine a first code block stream corresponding to each code block that is obtained from the Q first code block streams and carried in the second code block stream, and demultiplex each first code block stream. Identifier indication information corresponding to one code block in the Q first code block streams carried in the second code block stream may be an identifier of a first code block stream corresponding to the code block, or may be other information that can indicate the information, for example, position information of the code block in the second code block stream and the identifier of the first code block stream.

This embodiment of this application provides a possible data transmission mode, so that the second communications device on the demultiplexing side can determine, based on this mode, the first code block stream corresponding to each code block that is obtained from the Q first code block streams and carried in the second code block stream, and demultiplex each first code block stream. In this transmission mode, slot division is first performed, where there is an order relationship between all slots, and then at least one slot is allocated to each of the Q first code block streams. In the foregoing step 4202, code-block-based time division multiplexing may be performed on the code blocks in the Q first code block streams to obtain a to-be-processed code block sequence; and bits corresponding to the to-be-processed code block sequence are placed in the to-be-sent second code block stream, where each of the Q first code block streams corresponds to at least one slot, and an order of code blocks included in the to-be-processed code block sequence matches an order of slots corresponding to the code blocks included in the to-be-processed code block sequence.

With respect to all the slots obtained through division in this embodiment of this application, only some slots may be allocated to the Q first code block streams, or all the slots obtained through division may be allocated to the Q first code block streams. For example, 32 slots are obtained through division, but two first code block streams exist. Three of the 32 slots may be allocated to the two first code block streams, and remaining 29 slots may not be allocated to the first code block streams, for example, may be allocated to other code blocks, for example, may be allocated to idle code blocks or the foregoing OAM code blocks.

Figure 15:
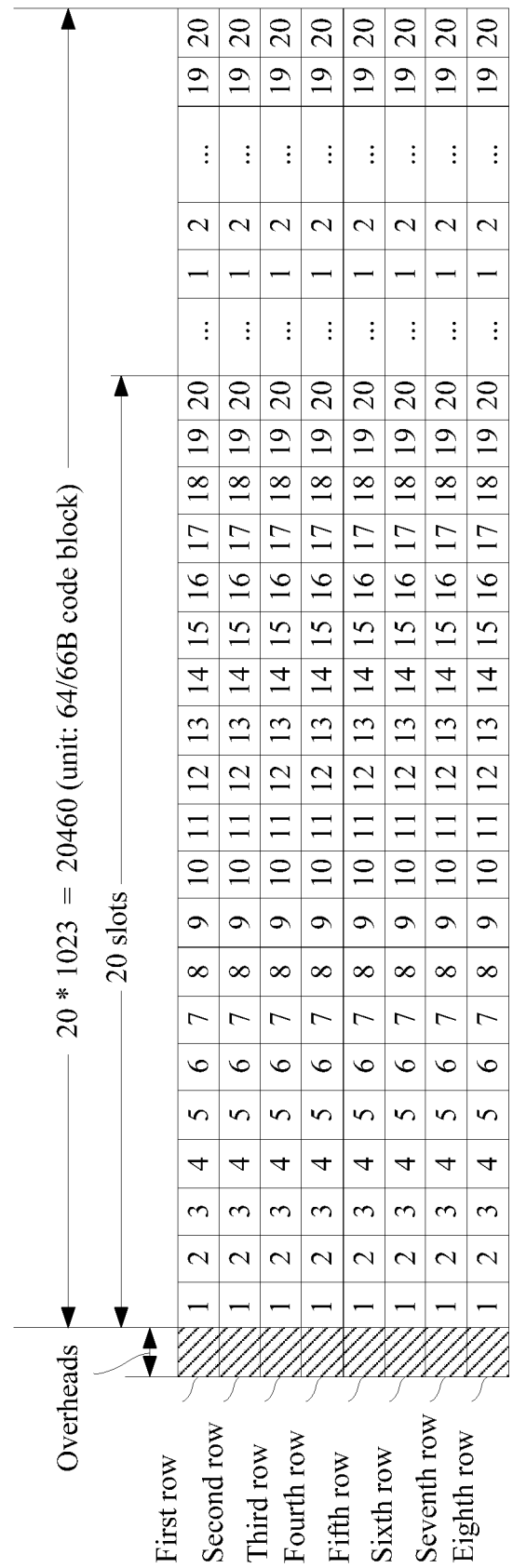
FIG. 15 is a schematic structural diagram of a FlexE frame according to an embodiment of this application.

Before step 4101, in this embodiment of this application, a network interface may be divided into slots, and one or more of the slots obtained through division are used to form a pipe to carry a code block stream. Specifically, interface slot division may be configured flexibly with reference to a specific application scenario. This embodiment of this application provides a slot division solution. For ease of description, in this embodiment of this application, the following content is described by using a FlexE technology as an example. In the example, an example in which a FlexE interface uses 64B/66B coding is used for description. In the FlexE, a synchronous digital hierarchy (SDH)/optical transport network (OTN) technology is used for reference, a fixed frame format is constructed for physical interface transmission, and time division multiplexing (TDM) slot division is performed. Different from the SDH/OTN, the FlexE may use 66 bits as a granularity for TDM slot division, where interleaving is performed between slots based on 66 bits, and 66 bits may correspondingly carry one 64B/66B code block. For example, FIG. 15 is a schematic structural diagram of a FlexE frame according to an embodiment of this application. As shown in FIG. 15, one FlexE frame may include eight rows, where a position of a first code block in each row is an area for carrying FlexE overheads (the area for carrying FlexE overheads may also be referred to as a frame header area) (a code block carried in the area for carrying FlexE overheads may be referred to as an overhead code block). Each row includes one overhead code block. Eight overhead code blocks included in the eight rows form a FlexE overhead frame, and 32 FlexE overhead frames form a FlexE overhead multiframe. As shown in FIG. 15, in an area other than the area for carrying FlexE overheads, TDM slot division may be performed. For example, a code block encoded by using 64B/66B coding is used as an example. When slot division is performed in an area other than the area for carrying overheads, 66 bits are used as a granularity for division, each row corresponds to 20*1023 66-bit bearer spaces, and an interface may be divided into 20 slots.

After slot division, a bandwidth corresponding to a single slot may be determined with reference to a bandwidth of the interface and a quantity of slots. With reference to the slot division shown in FIG. 15, for a 100 Gigabit Ethernet (GE) interface, a bandwidth of the 100GE interface is 100 Gbps (in units of Gbps, 1000 megabits per second). In this case, a bandwidth of each slot may be approximately a bandwidth of 100 Gbps divided by 20, that is, approximately 5 Gbps. A FlexE group may include at least one interface, for example, t 100 Gbps interfaces. In this case, when the FlexE group is used as an NNI, a total quantity of slots is t*20.

In the foregoing example, only a slot division manner is shown as an example. A person skilled in the art may know that, other slot division manners may also exist. When a plurality of slots are obtained through division, the plurality of slots may include at least two slots, where bandwidths corresponding to the two slots are different from each other. For example, a bandwidth of one slot is 5 Gbps, and a bandwidth of another slot is 10 Gbps. The slot division manner, and a manner of determining the bandwidth of each slot are not limited in this embodiment of this application.

After the slot division, in this embodiment of this application, a correspondence between any first code block stream carried in the second code block stream and a slot of the second code block stream may be established. Optionally, allocating a slot to any code block stream may also be described as allocating a slot to a pipe carrying a code block stream. In an optional embodiment, based on a service bandwidth of a pipe carrying a code block stream and a bandwidth corresponding to each slot, a quantity of slots allocated to the pipe may be determined. Optionally, in other words, based on a service rate of the pipe carrying the code block stream and a rate corresponding to each slot, the quantity of slots allocated to the pipe may be determined.

Optionally, in a FlexE system architecture, several physical interfaces may be cascaded and bonded into a FlexE group, and any plurality of slots in all slots in the FlexE group may be combined to carry an Ethernet logical port. For example, when a bandwidth of a single slot is 5 Gbps, a first code block stream whose bandwidth is 10GE requires two slots, a first code block stream whose bandwidth is 25GE requires five slots, and a first code block stream whose bandwidth is 150GE requires 30 slots. If the coding mode is 64B/66B coding, a sequentially transmitted 66-bit code block stream is still visible on an Ethernet logical port.

With respect to slot allocation on an interface, a total bandwidth (for example, a product of a slot quantity and a bandwidth corresponding to a slot having a same bandwidth) of slots configured for a code block stream is not lower than an effective bandwidth of the code block stream. The effective bandwidth of the code block stream may be a total bandwidth occupied by other data code blocks and control-type code blocks than an idle code block in the code block stream. To be specific, the code block stream needs to include a reserved code block, for example, an idle code block, so that the code block stream may be adapted to an allocated slot (or pipe) through addition or deletion of the idle code block. On this basis, in this embodiment of this application, optionally, a total bandwidth of slots configured for a code block stream is not less than an effective bandwidth of the code block stream; or optionally, a product of a quantity of slots configured for a code block stream and a bandwidth corresponding to a single slot is not lower than an effective bandwidth of the code block stream.

As shown in FIG. 15, each of the slots obtained through division may have an identifier. An order relationship exists between the slots obtained through division. For example, 20 slots in FIG. 15 may be identified as a slot 1, a slot 2, . . . , a slot 20 sequentially based on the identifiers. A slot allocated from the 20 slots to a code block stream may be configured flexibly. For example, allocation of the 20 slots may be identified based on identifiers of code block streams to which the slots belong. In this embodiment of this application, if a plurality of slots that belong to a code block stream are allocated to the code block stream, the plurality of allocated slots may be consecutive, or may not be consecutive. For example, two slots, that is, the slot 0 and the slot 1, may be allocated to the code block stream, or two slots, that is, the slot 0 and the slot 3, may be allocated to the code block stream. This is not limited in this embodiment of this application.

In an optional embodiment, with respect to slots for carrying a first code block stream corresponding to a data unit in the second code block stream in this embodiment of this application, a total bandwidth (for example, a product of a slot quantity and a bandwidth corresponding to a slot having a same bandwidth) of slots configured for the first code block stream is not lower than an effective bandwidth of the first code block stream. The effective bandwidth of the first code block stream may be a total bandwidth occupied by other data code blocks and control-type code blocks than an idle code block in the first code block stream. To be specific, the first code block stream needs to include a reserved code block, for example, an idle code block, so that the code block stream may be adapted to an allocated slot (or pipe) through addition or deletion of the idle code block. On this basis, in this embodiment of this application, optionally, a total bandwidth of slots configured for a first code block stream is not lower than an effective bandwidth of the first code block stream; or optionally, a product of a quantity of slots configured for a first code block stream and a bandwidth corresponding to a single slot is not lower than an effective bandwidth of the first code block stream.

As shown in FIG. 15, in this embodiment of this application, each of slots obtained through division for carrying a first code block stream corresponding to a data unit in the second code block stream may have an identifier. A determined order may exist between the slots obtained through division. For example, 20 slots in FIG. 15 may be identified as a slot 1, a slot 2, . . . , a slot 20 sequentially based on the identifiers. A slot allocated from the 20 slots to a code block stream may be configured flexibly. For example, allocation of the 20 slots may be identified based on identifiers of first code block streams to which the slots belong. In this embodiment of this application, if a plurality of slots that belong to a first code block stream are allocated to the code block stream, the plurality of allocated slots may be consecutive, or may not be consecutive. For example, two slots, that is, the slot 0 and the slot 1, may be allocated to the first code block stream, or two slots, that is, the slot 0 and the slot 3, may be allocated to the first code block stream. This is not limited in this embodiment of this application.

A total bandwidth of slots corresponding to a first code block stream may be determined based on a quantity of slots corresponding to the first code block stream and a bandwidth allocated to each slot corresponding to the first code block stream. For example, the total bandwidth of slots corresponding to the first code block stream may be a product of the quantity of slots corresponding to the first code block stream and the bandwidth allocated to each slot corresponding to the first code block stream. After step 4101, and before step 4102, for a first code block stream in the Q first code block streams that includes a preset proportion of idle code blocks, addition or deletion processing of an idle code block is performed on the first code block stream based on a bandwidth of the first code block stream and the total bandwidth of slots corresponding to the first code block stream.

Addition and deletion processing of an idle code block is an effective means for implementing rate adaptation. The following uses the FlexE as an example for description. Each logical port may carry an Ethernet medium access control (MAC) packet data unit sequence stream. On a conventional Ethernet interface, a packet in the MAC packet data unit sequence stream may have a start and an end. An inter-packet gap (IPG) exists between packets. Optionally, the gap may be filled with an idle character. The MAC packet data unit sequence stream and the idle character generally need to undergo processing such as encoding and scrambling and are then transmitted. For example, 1 GE uses 8B/10B coding; 10GE, 25GE, 40GE, 50GE, 100GE, 200GE, 400GE, and so on generally use 64B/66B coding. The encoded MAC packet data unit sequence stream and idle character are converted into 64B/66BB code blocks.

In a possible embodiment, encoded code blocks may include a start code block (where the start code block may be an S code block), a data code block (where the data code block may be a D code block for short), a termination code block (where the termination code block may be a T code block), and an idle code block (where the idle code block may be an I code block for short) corresponding to a MAC packet data unit.

With reference to the example in FIG. 15, after a 100GE interface introduces FlexE overheads based on a 64B/66B code block, a remaining bandwidth is further divided into 20 slots, and two slots can further ensure loading of one code block stream of a 10GE-bandwidth. In a possible embodiment, rate adaptation of a FlexE client may be performed in the FlexE by adding or deleting an idle code block. For example, when a bandwidth of a code block stream including an idle code block is 11GE, but an effective bandwidth is lower than a 10G bandwidth of two FlexE slots, a total bandwidth of two 5G slots allocated to the first code block stream is 10G; in this case, some idle code blocks in the code block stream may be deleted. When a bandwidth of a first code block stream is 9G; a total bandwidth of slots allocated to the code block stream is 10G; in this case, more idle code blocks may be added to the first code block stream. Optionally, in the FlexE, a code block may be directly operated, or a decoded service packet stream and an idle character may be operated.

In this embodiment of this application, optionally, a quantity of idle code blocks need to be preconfigured for the second code block stream. In a transmission process of the second code block stream, optionally, addition or deletion processing of an idle code block may also be performed on the second code block stream based on a difference between a bandwidth of a pipe carrying the second code block stream and a rate of the second code block stream. Specifically, addition or deletion of an idle code block may be performed on the idle code blocks between adjacent data units in the second code block stream, so that the second code block stream matches the bandwidth of the pipe carrying the second code block stream. For example, when the rate of the second code block stream is lower than the bandwidth of the pipe carrying the second code block stream, some idle code blocks may be added between data units in the second code block stream; or when the rate of the second code block stream is not lower than the bandwidth of the pipe carrying the second code block stream, it may be preconfigured that an idle code block between data units in the second code block stream is deleted.

Optionally, in this embodiment of this application, a correspondence between slots for carrying the first code block streams in the second code block stream and the first code block streams may be predefined, and is configured in the first communications device on the multiplexing side and the second communications device on the demultiplexing side, or may be sent by the multiplexing side to the demultiplexing side, or is sent by the demultiplexing side to the multiplexing side. Alternatively, after a centralized server determines a correspondence between slots and the first code block streams, the correspondence between the slots and the first code block streams is sent to the first communications device on the multiplexing side and the second communications device on the demultiplexing side. The correspondence between the slots and the first code block streams may be sent periodically. In an optional embodiment, slot allocation indication information is carried in a first preset code block in the second code block stream; and the slot allocation indication information is used to indicate a correspondence between the Q first code block streams and slots. To be specific, the slot allocation indication information is used to indicate an identifier of a slot allocated to each of the Q first code block streams.

Figure 18:
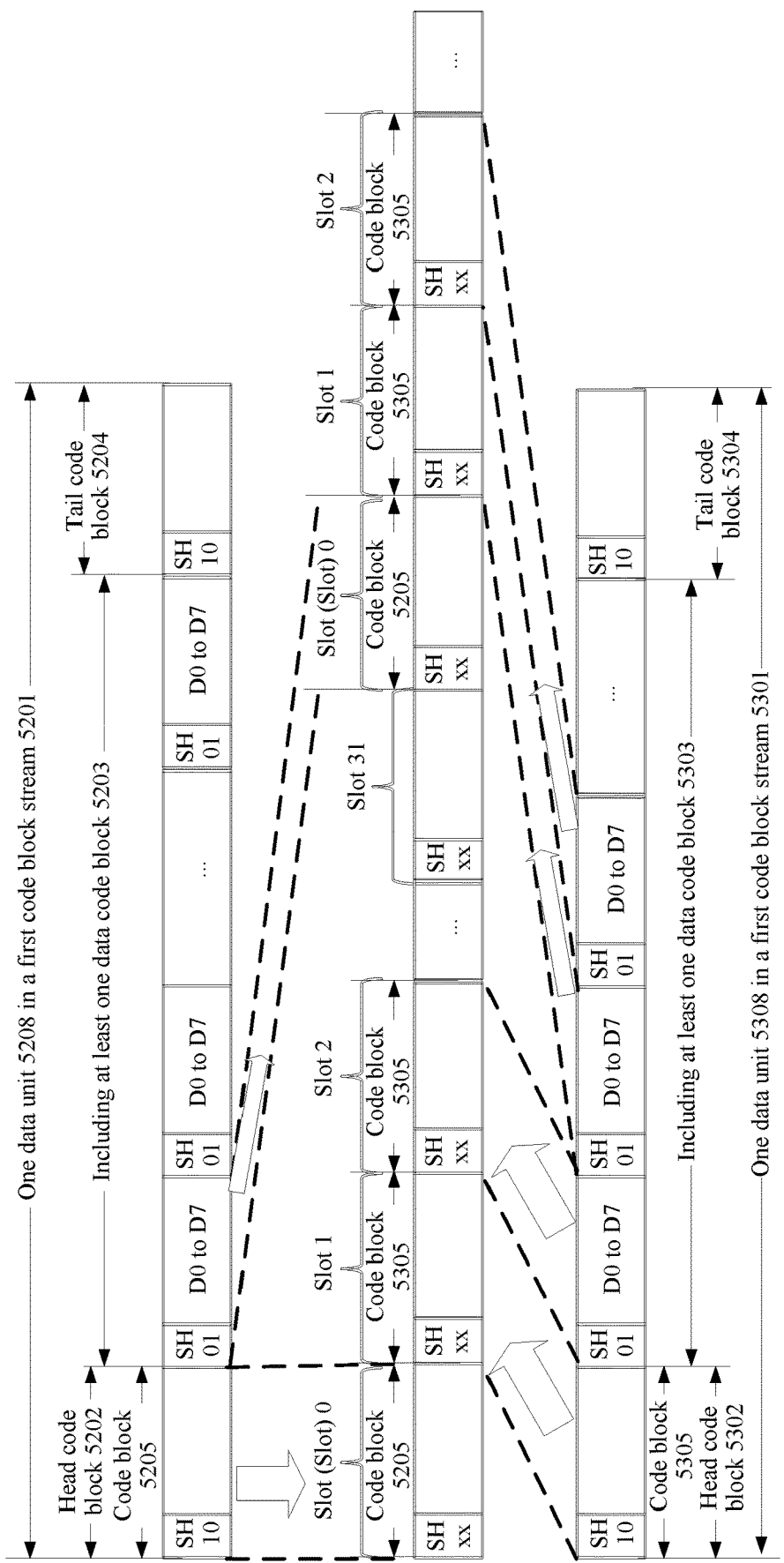
FIG. 18 is a schematic structural diagram of a first code block stream according to an embodiment of this application.

For example, FIG. 16 is a schematic structural diagram of slot allocation indication information transmitted in a second code block stream according to an embodiment of this application. As shown in FIG. 16, when a head code block is an O code block, for a structure of the O code block, refer to content shown in FIG. 10. The slot allocation indication information may be carried in three available bytes D1 to D3 of the O code block whose type field is 0x4B. For example, as shown in FIG. 18, an identifier of a first code block stream corresponding to a slot is carried in D1 to D3 of a codeword of a head code block whose block type is 0x4B and whose O code is 0xA. As shown in FIG. 16, an identifier of a first code block stream corresponding to a slot is correspondingly carried in either of two bytes D2 and D3 of each code block.

Eight bits of the D2 byte and the D3 byte have 256 ID identifier spaces. 0x00 or 0xFF may be used to identify that the slot is unallocated. In this case, any part of 254 remaining numeric identifiers may be used to identify allocation of a combination of 32 slots. Optionally, first four bits in the D1 byte are used for a multiframe indicator, indicating 16 continuous data units with encapsulation overhead blocks in the second code block stream. A value of the multiframe indicator MFI is 0 to 15 (0 to F in hexadecimal notation), where a block whose MFI=0 may indicate an identifier of a first code block stream corresponding to a slot 0 and an identifier of a first code block stream corresponding to a slot 1, and a block whose MFI=1 may indicate an identifier of a first code block stream corresponding to a slot 2 and an identifier of a first code block stream corresponding to a slot 3, and so on.

As shown in FIG. 16, the slot 0 is used to carry a first one of the first code block streams (in an optional embodiment, the first one of the first code block streams may also be expressed as a client 1), and if an identifier of the first one of the first code block streams is 0x01, a D2 field of the code block whose MFI=0 in FIG. 16 is filled with 0x01. The slot 1 is used to carry a first one of the second code block streams (in an optional embodiment, the second one of the first code block streams may also be expressed as a client 2), and if an ID identifier of the second one of the first code block streams is 0x08, a D3 field of the code block whose MFI=0 in FIG. 16 is filled with 0x08. The slot 2 is used to carry a third one of the first code block streams (in an optional embodiment, the third one of the first code block streams may also be expressed as a client 3), and if an ID identifier of the third one of the first code block streams is 0x08, a D2 field of the code block whose MFI=1 in FIG. 16 is filled with 0x08. In this example, the slot 1 and the slot 2 are allocated to and identified as the same first code block stream. When a plurality of slots are allocated to one first code block stream, an order of sending code blocks or bits in the first code block stream is consistent with an order of sending them in the second code block stream. Optionally, if a slot is unallocated, 0x00 or 0xFF may be used for indicating. For example, if a slot 4 is unallocated, in a block whose MFI=2, a field for indicating an identifier of a first code block stream corresponding to the slot 4 may be filled with 0x00 or 0xFF. Optionally, the slot allocation indication information may also be transmitted on a code block between adjacent data units, for example, a code block of a control type included between adjacent data code blocks.

In this embodiment of this application, in an optional embodiment, a quantity of type-1 data code blocks included in one data unit in the second code block stream may be determined in advance through calculation, for carrying the Q first code block streams, so that an integer number of code blocks in a first code block stream can be loaded into one data unit in the second code block stream (this form may also be described as boundary alignment, or each slot boundary and code block boundary may be determined based on a data unit in the second code block stream). Optionally, in a solution provided by this embodiment of this application, a quantity of type-1 data code blocks included in one data unit in the at least one data unit included in the second code block stream is determined based on M2 and a common multiple of N1 and M2. For example, a quantity of type-1 data code blocks included in one data unit is at least a quotient of the common multiple of N1 and M2 by M2. The quantity of type-1 data code blocks may be greater than the quotient of the common multiple of N1 and M2 by M2. Alternatively, a quantity of type-1 data code blocks included in one data unit in the at least one data unit included in the second code block stream is determined based on M2 and a least common multiple of N1 and M2. For example, a quantity of type-1 data code blocks included in one data unit is at least a quotient of the least common multiple of N1 and M2 by M2. A quantity of type-1 data code blocks included in one data unit is greater than the quotient of the least common multiple of N1 and M2 by M2. Therefore, a type-1 data code block can carry other bits of a code block corresponding to a slot that is not allocated to a first code block stream. For example, if a slot is unallocated, a type-1 data code block may carry bits corresponding to a preset code block (for example, an idle code block or an error code block) corresponding to the slot. Optionally, with respect to data code blocks in this embodiment of this application, a defined type-1 data code block may be a data code block carrying a code block corresponding to each slot, and a type-2 data code block may be used to carry other information bits (for example, any one or more of slot allocation indication information, identifier indication information, and multiplexing indication information). A position of a type-2 data code block in a data unit may be fixed, or configured and then notified to the communications device on the multiplexing side and the communications device on the demultiplexing side.

In this embodiment of this application, optionally, the coding mode of the first code block stream and the coding mode of the second code block stream may be the same or may be different. For ease of description in the following content, for example, both the first code block stream and the second code block stream use a 64B/66BB coding mode. An example in which the first code block stream is of a 64B/66BB coding type and the second code block stream is of the 64B/66BB coding type is hereinafter used for description.

Figure 17:
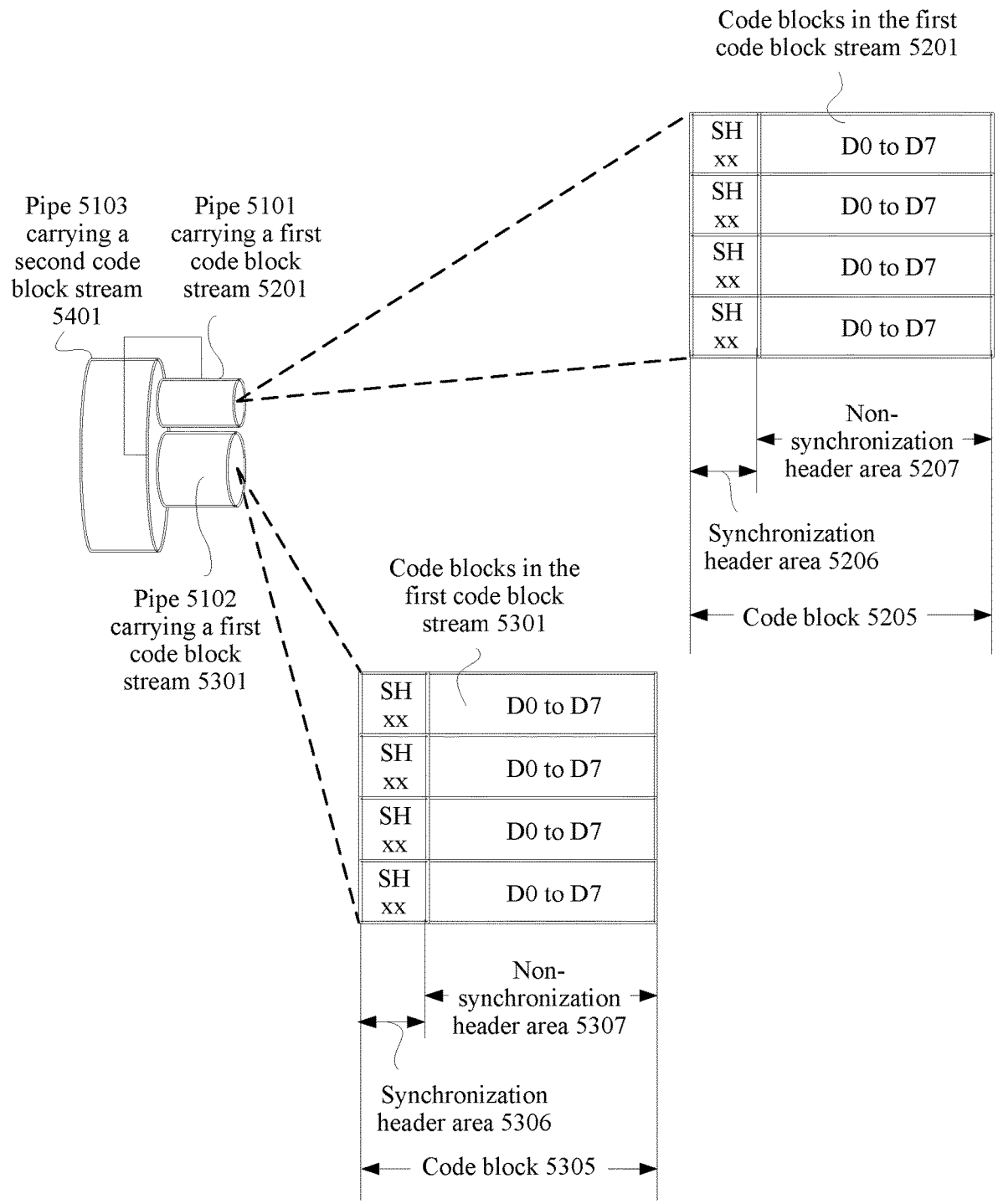
FIG. 17 is a schematic structural diagram of multiplexing of code block streams according to an embodiment of this application.

For example, FIG. 17 is a schematic structural diagram of multiplexing of code block streams according to an embodiment of this application. As shown in FIG. 17, a first code block stream 5201 and a first code block stream 5301 are multiplexed into a second code block stream 5401. In other words, a pipe 5101 carrying the first code block stream 5201 and a pipe 5102 carrying the first code block stream 5301 are multiplexed into a pipe 5103 carrying the second code block stream 5401 in FIG. 17. If the pipes carrying the first code block streams are referred to as low order pipes, and the pipe carrying the second code block stream is referred to as a high order pipe, in FIG. 17, two low order pipes (the pipe 5101 carrying the first code block stream 5201 and the pipe 5102 carrying the first code block stream 5301) are multiplexed into one high order pipe (the pipe 5103 carrying the second code block stream 5401).

The first code block streams may be of a plurality of coding types, for example, an M/N coding type, or a non M/N coding type. In this example, an example in which a first code block stream is of a 64B/66BB coding type is used for description. As shown in FIG. 17, the first code block stream 5201 includes a plurality of code blocks 5205, and each code block 5205 includes a synchronization header area 5206 and a non-synchronization header area 5207. For example, FIG. 18 is a schematic structural diagram of a first code block stream according to an embodiment of this application. As shown in FIG. 17 and FIG. 18, the first code block stream 5201 includes a plurality of data units 5208. For example, FIG. 18 is a schematic structural diagram of only one data unit 5208 in the first code block stream 5201. As shown in FIG. 18, the data unit 5208 may include a head code block 5202, one or more data code blocks 5203, and a tail code block 5204. To be specific, a code block 5205 included in the first code block stream 5201 may be a control code block (for example, the head code block 5202 and the tail code block 5204), or may be the data code block 5203, or may be an idle code block. Alternatively, the code block in the first code block stream in this embodiment of this application may be a code block included between adjacent data units in the first code block stream, for example, an idle code block included between adjacent data units in the first code block stream. The synchronization header area 5206 of the code block 5205 may carry type indication information of the code block. For example, when the code block 5205 is the data code block 5203, the type indication information of the code block that is carried in the synchronization header area 5206 of the code block 5205 may be 01, and is used to indicate that the code block 5205 is a data code block. For another example, when the code block 5205 is the head code block 5202 or the tail code block 5204, the type indication information of the code block that is carried in the synchronization header area 5206 of the code block 5205 may be 10, and is used to indicate that the code block 5205 is a control code block.

As shown in FIG. 17, the first code block stream 5301 includes a plurality of code blocks 5305, and each code block 5305 includes a synchronization header area 5306 and a non-synchronization header area 5307. For example, FIG. 18 shows a schematic structural embodiment of a first code block stream. As shown in FIG. 17 and FIG. 18, the first code block stream 5301 includes a plurality of data units 5308. For example, FIG. 18 is a schematic structural diagram of only one data unit 5308 in the first code block stream 5301. As shown in FIG. 18, the data unit 5308 may include a head code block 5302, one or more data code blocks 5303, and a tail code block 5304. To be specific, a code block 5305 included in the first code block stream 5301 may be a control code block (for example, the head code block 5302 and the tail code block 5304), or may be the data code block 5303, or may be an idle code block. Alternatively, the code block in the first code block stream in this embodiment of this application may be a code block included between adjacent data units in the first code block stream, for example, an idle code block included between adjacent data units in the first code block stream. The synchronization header area 5306 of the code block 5305 may carry type indication information of the code block. For example, when the code block 5305 is the data code block 5303, the type indication information of the code block that is carried in the synchronization header area 5306 of the code block 5305 may be 01, and is used to indicate that the code block 5305 is a data code block. For another example, when the code block 5305 is the head code block 5302 or the tail code block 5304, the type indication information of the code block that is carried in the synchronization header area 5306 of the code block 5305 may be 10, and is used to indicate that the code block 5305 is a control code block.

In this example, for example, a slot (which may be expressed as a slot) 0 is allocated to the first code block stream 5201, and a slot 1 and a slot 2 are allocated to the first code block stream 5301. In this example, 32 slots in total are obtained through division, and none of the remaining slots 4 to 31 is allocated. The unallocated slots may be filled with code blocks of a fixed pattern. For example, for a 64B/66B code block, a code block of another determined pattern such as an idle (idle) code block, an error (Error) code block, or another defined code block may be used for filling.

For example, FIG. 18 is a schematic structural diagram of a code block obtained from a first code block stream based on a correspondence between a slot and the first code block stream. As shown in FIG. 18, the slot 0 to the slot 31 are ordered based on identifiers of the slots, where the identifiers of the slots are 0 to 31. Therefore, based on the order of the slot 0 to the slot 31, the first communications device sequentially and cyclically obtains code blocks corresponding to the slot 0 to the slot 31. As shown in FIG. 18, the first communications device first obtains a code block corresponding to the slot 0, and obtains a code block 5205 from the first code block stream 5201 because the slot 0 is allocated to the first code block stream 5201; then obtains a code block corresponding to the slot 1, and obtains a code block 5305 from the first code block stream 5301 because the slot 1 is allocated to the first code block stream 5301; then obtains a code block corresponding to the slot 2, and obtains a code block 5305 from the first code block stream 5301 because the slot 2 is allocated to the first code block stream 5301; and then obtains a code block corresponding to the slot 3, and may fill all the slot 3 to the slot 31 with code blocks of a determined pattern such as idle code blocks because all the slot 3 to the slot 31 are unallocated. Then the code blocks corresponding to the slot 0 to the slot 31 are cyclically obtained. In this embodiment of this application, a sequence corresponding to a code block corresponding to each slot in FIG. 18 may be referred to as a to-be-processed code block sequence.

Figure 19:
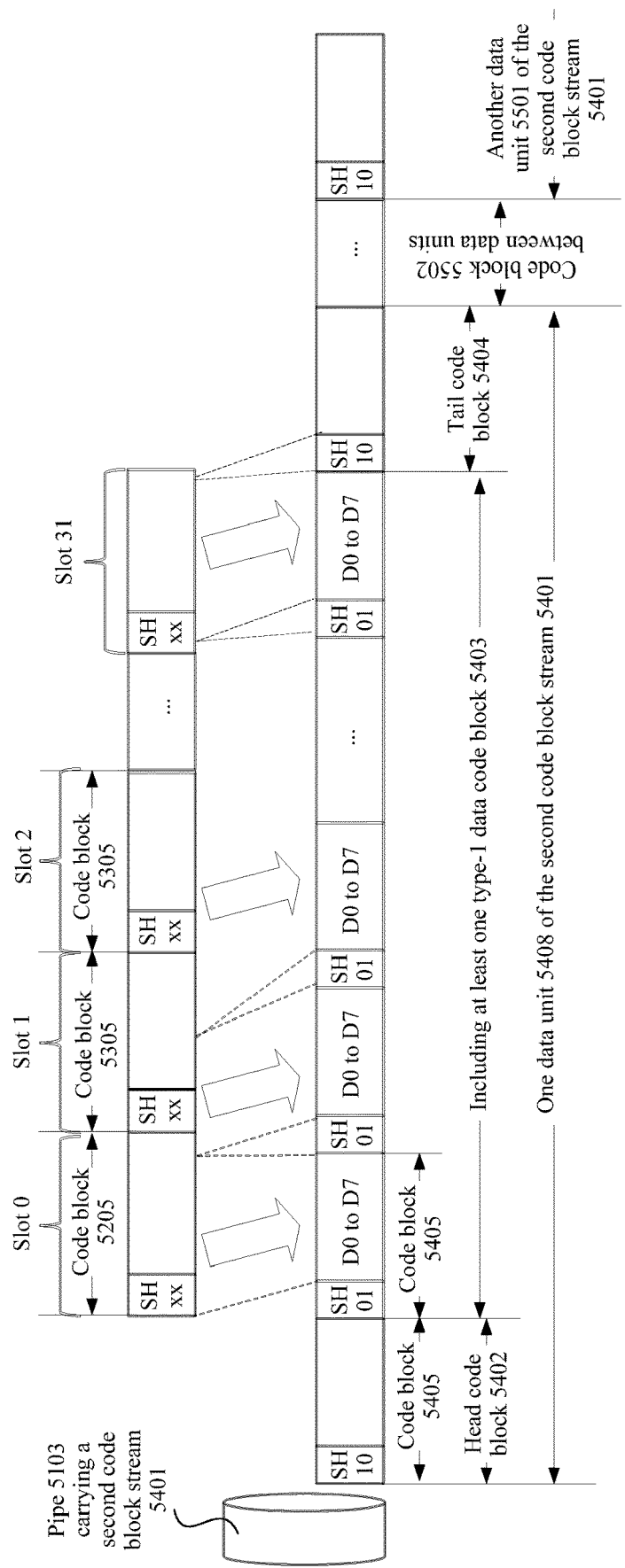
FIG. 19 is a schematic structural diagram of a second code block stream according to an embodiment of this application.

For example, FIG. 19 is a schematic structural diagram of a second code block stream according to an embodiment of this application. As shown in FIG. 19, a second code block stream 5401 that enters a pipe 5103 carrying the second code block stream 5401 may include one or more data units 5408. FIG. 19 is a schematic structural diagram of one data unit 5408. As shown in FIG. 19, the data unit 5408 may include a plurality of code blocks 5405, and a code block 5405 may include a synchronization header area 5406 and a non-synchronization header area 5407. As shown in FIG. 19, the data unit 5408 may include a head code block 5402, one or more data code blocks 5403, and a tail code block 5404. To be specific, the code block 5405 included in the second code block stream 5401 may be a control code block (for example, the head code block 5402 and the tail code block 5404), or may be the data code block 5403. The synchronization header area 5406 of the code block 5405 may carry type indication information of the code block. For example, when the code block 5405 is the data code block 5403, the type indication information of the code block that is carried in the synchronization header area 5406 of the code block 5405 may be 01, and is used to indicate that the code block 5405 is a data code block. For another example, when the code block 5405 is the head code block 5402 or the tail code block 5404, the type indication information of the code block that is carried in the synchronization header area 5406 of the code block 5405 may be 10, and is used to indicate that the code block 5405 is a control code block.

As shown in FIG. 19, in this embodiment of this application, an obtained or generated code block corresponding to each slot is placed in a payload area of the second code block stream, and may be placed in a payload area of any one or more of a head code block, a tail code block, a type-1 data code block, and a type-2 data code block. In this example, an example in which the obtained or generated code block corresponding to each slot is placed in the type-1 data code block in the second code block stream is used for description.

A quantity of data code blocks included in one data unit in the second code block stream in this embodiment of this application may be flexibly determined. An example in which both a first code block stream and the second code block stream use 64B/66B coding is used for description. In the solution provided by this embodiment of this application, if one data unit in the second code block stream includes Hb type-1 data code blocks used for carrying code blocks corresponding to all slots, TDM slot division is performed based on some or all of Hlcm bits (a total quantity of bits in payload areas of the Hb type-1 data code blocks is Hp, where Hlcm is less than or equal to Hp) of bits corresponding to the payload areas (a payload area of one type-1 data code block carries H bits) of the Hb type-1 data code blocks, to obtain several low order slot granularities. A combination of the slot granularities obtained through division is used as a low order pipe (the low order pipe is a pipe carrying the first code block stream) to carry a 64B/66B code block in the first code block stream or a code block obtained by compressing a code block in the first code block stream. Herein TDM slot division for the Hlcm bits equivalently corresponds to TDM slot division for the to-be-processed code block sequence obtained after step 4101. For example, when a coding type of the first code block stream is 64B/66B coding and compression processing is not used (compression processing may also be referred to as transcoding compression processing), a high order pipe (the high order pipe is a pipe carrying the second code block stream) carries some or all of the Hlcm bits (the total quantity of bits in the payload areas of the Hb type-1 data code blocks is Hp, where Hlcm is less than or equal to Hp) of the bits corresponding to the payload areas (a payload area of one type-1 data code block carries H bits) of the Hb type-1 data code blocks in the data unit in the second code block stream, and the Hlcm bits correspond to g 66B granularities and may be divided into p slots, where p may be exactly divided by g, and g and p are both positive integers. When compression processing is used, a high order pipe (the high order pipe is a pipe carrying the second code block stream) carries some or all of the Hlcm bits (the total quantity of bits in the payload areas of the Hb type-1 data code blocks is Hp) of the bits corresponding to the payload areas (a payload area of one type-1 data code block carries H bits) of the Hb type-1 data code blocks in the data unit in the second code block stream, where Hlcm is less than or equal to Hp. Optionally, Hp corresponds to g1 M2/N2 bit payload granularities, and g1*N2 is an entirety of the total quantity of bits in the payload areas of all the type-1 data code blocks in the data unit in the second code block stream. With respect to the Hlcm bits, g3*N3 bits correspond to g3 M3/N3 bit blocks (for example, 512B/514B encoded bit blocks). One M3/N3 code block granularity equivalently corresponds to g3*k 66B granularities of a to-be-processed code block stream (for example, a 512B/514B encoded bit block is equivalent to four 66B granularities). The equivalently corresponding to-be-processed code block stream is divided into p slots, where p may be exactly divided by g, and g and p are both positive integers.

This embodiment of this application provides an optional embodiment for determining a quantity of data code blocks (or type-1 data code blocks for carrying the first code block stream) included in one data unit in the second code block stream. In the description about this embodiment, for example, the first code block stream uses an M1/N1 bit coding mode, and the second code block stream uses an M2/N2 bit coding mode, without considering compress processing. Because each code block in the first code block stream is N1 bits, and needs to be loaded into a payload area of the second code block stream. A payload area of a data code block in the second code block stream is M2 bits. In this case, a common multiple of N1 and M2 is calculated. A quantity of data code blocks included in one data unit in the second code block stream may be an integer multiple of a quotient of the common multiple of N1 and M2 by N2. In an optional embodiment, a quantity of data code blocks included in one data unit in the second code block stream may be an integer multiple of a quotient of a least common multiple of N1 and M2 by N2.

Using an example with reference to FIG. 19, for example, if coding types of the first code block stream and the second code block stream are both 64B/66B coding, a value of lcm(66, 64) is 2112, where lcm(66, 64) means obtaining a least common multiple of 66 and 64. A quantity of data code blocks included in one data unit in the second code block stream may be an integer multiple of 33 (33 is a quotient of a common multiple 2112 of 66 and 64 by bits 64 in a payload area of the data code block in the second code block stream). Assuming that one data unit in the second code block stream includes 33 data code blocks, it indicates that the 33 data code blocks in the second code block stream carry code blocks corresponding to 32 (32 is a quotient of a common multiple 2112 of 66 and 64 by bits 64 in one code block in the first code block stream) slots. When a first code block stream is allocated to a slot, a code block corresponding to the slot is a code block obtained from the first code block stream corresponding to the slot. When no first code block stream is allocated to the slot, a code block corresponding to the slot is a code block of a determined pattern.

A plurality of manners may be available for slot division. This embodiment of this application provides a possible embodiment. In the embodiment, a quantity of bits in a payload area of a data code block in one data unit in the second code block stream is calculated. For example, in the example with reference to FIG. 19, a quantity of bits in payload areas of data code blocks in one data unit in the second code block stream is 2122 (2122 is a product of a quantity 33 of data code blocks included in one data unit in the second code block stream and 64 bits of a non-synchronization header area of the data code block) bits. When the 2122 bits are all used to carry code blocks in the first code block stream, a maximum of thirty-two 64B/66B code blocks can be carried. Therefore, in slot division, a maximum quantity of slots that can be obtained is an integer multiple of 32. Alternatively, a quantity of slots may be a numeric value that can exactly divide 32. For example, 16 slots, 8 slots, or 4 slots are obtained through division.

Optionally, a total quantity of bits in payload areas of all type-1 data code blocks in one data unit in the second code block stream may not be limited to the foregoing common multiple relationship. For example, in the foregoing example, a total quantity of bits in payload areas of all type-1 data code blocks in one data unit in the second code block stream is greater than 2122. In this way, when the 2122 bits are used to carry bits corresponding to the code blocks in the first code block stream, remaining bits may be reserved and not used, or may be used to carry other indication information. In an actual application, optionally, when a quantity of bits in payload areas of all data code blocks (including all type-1 data code blocks and all type-2 data code blocks) included in one data unit in the second code block stream is determined, transmission efficiency and reserved idle code blocks may be considered. If a total quantity of bits in payload areas of all data code blocks in one data unit in the second code block stream is larger, the data unit is longer, and overheads are lower.

As shown in FIG. 19, all bits corresponding to a code block in a to-be-processed code block sequence are sequentially placed in a payload area of a type-1 data unit in the second code block stream. As can be seen, a code block 5205 corresponding to a slot 0 is encoded by using the 64B/66B coding type, and an obtained total quantity of bits of the code block 5205 is 66, but a quantity of bits occupied by a non-synchronization header area 5407 of a data code block 5403 in the second code block stream 5401 is 64. Therefore, one data code block 5403 in the second code block stream carries first 64 bits of the code block 5205 corresponding to the slot 0, and another data code block 5403 in the second code block stream carries last 2 bits of the code block 5205 corresponding to the slot 0, and first 62 bits of the code block 5305 corresponding to a slot 1, and so on. As can be seen from this embodiment, when a total quantity of bits of one code block in the first code block stream is greater than a quantity of bits carried in a payload area of one type-1 data code block in the second code block stream, all bits corresponding to one code block in the first code block stream may be carried in payload areas of two data code blocks in the second code block stream.

Figure 20:
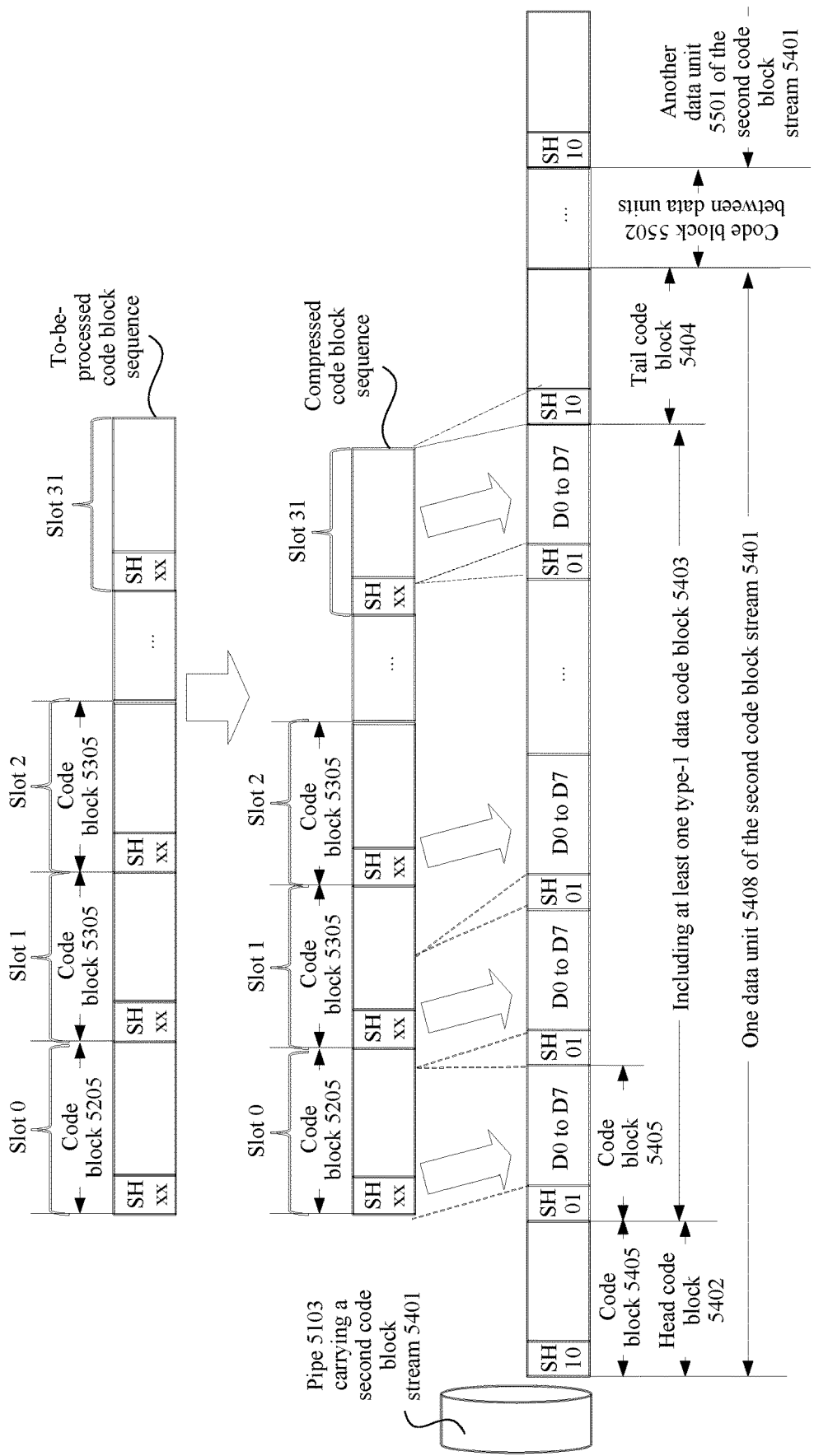
FIG. 20 is a schematic structural diagram of another second code block stream according to an embodiment of this application.

To further improve data transmission efficiency, improve encapsulation efficiency, and avoid excessive bandwidth expansion caused by encapsulation layer by layer, this embodiment of this application provides another optional data transmission solution. In the foregoing step 4102, the placing, in the to-be-sent second code block stream, bits corresponding to the to-be-processed code block sequence includes: compressing R continuous code blocks in the to-be-processed code block sequence to obtain a compressed code block sequence, where R is a positive integer; and placing, in the to-be-sent second code block stream, bits corresponding to the compressed code block sequence. For example, FIG. 20 is a schematic structural diagram of another second code block stream according to an embodiment of this application. FIG. 20 is an improvement on a basis of FIG. 19. In FIG. 20, a sequence including obtained code blocks corresponding to all slots is referred to as a to-be-processed code block sequence. Compression processing is performed on the to-be-processed code block sequence to obtain a compressed code block sequence, and then the compressed code block sequence is placed in the second code block stream. Optionally, the compressed code block sequence may be placed in a payload area of a type-1 data code block in the second code block stream.

In an optional embodiment, bits corresponding to a synchronization header area and a non-synchronization header area of one code block in a first code block stream may be continuously placed in the payload area of the second code block stream. If the to-be-processed code block sequence without being compressed is directly placed in the second code block stream, all bits in synchronization header areas and non-synchronization areas of all code blocks in the to-be-processed code block sequence are placed in the second code block stream continuously. If the to-be-processed code block sequence after being compressed is placed in the second code block stream, all bits in synchronization header areas and non-synchronization areas of all code blocks in the compressed code block sequence are placed in the second code block stream continuously.

In other words, if the to-be-processed code block sequence without being compressed is directly placed in the second code block stream, all bits in a synchronization header area and a non-synchronization area of one code block obtained from the first code block stream in the to-be-processed code block sequence are placed in the second code block stream continuously. If the to-be-processed code block sequence after being compressed is placed in the second code block stream, bits in the compressed code block sequence that correspond to all bits in a synchronization header area and a non-synchronization area of one code block obtained from the first code block stream in the compressed code block sequence are placed in the second code block stream continuously.

An example in which a to-be-processed code block sequence is compressed into one code block in a compressed code block sequence is hereinafter used for description. If a code block without being compressed in a to-be-processed code block sequence is directly placed in the second code block stream, a case of a code block in the to-be-processed code block sequence is similar to the case in which the to-be-processed code block sequence is compressed into one code block in the compressed code block sequence. In this example, an example is used with reference to FIG. 20 for description. As shown in FIG. 20, all bits included in a code block 5205 corresponding to a slot 0 in the compressed code block sequence (for example, if the code block includes a synchronization header area and a non-synchronization area, all bits corresponding to the code block are all bits corresponding to the synchronization header area and the non-synchronization header area of the code block) are placed in a payload area of a type-1 data code block in the second code block stream continuously. To be specific, if only payload areas of all type-1 data code blocks in one data unit in the second code block stream are considered, for example, if only a sequence of type-1 data code blocks included in one data unit in the second code block stream is simply considered, with respect to only a sequence of payload areas in the sequence of the type-1 data code blocks, all bits (which may be obtained from a synchronization header area and a non-synchronization header area of one code block in the first code block stream) of a code block corresponding to a slot and included in the compressed code block sequence are continuously placed in one or more payload areas in the sequence of the payload areas in the sequence of the type-1 data code blocks in the data unit in the second code block stream. In other words, in the foregoing example, if only payload areas of all type-1 data code blocks in one data unit in the second code block stream are considered, for example, if only a sequence of type-1 data code blocks included in one data unit in the second code block stream is simply considered, with respect to only a sequence of payload areas in the sequence of the type-1 data codes, all bits of all code blocks corresponding to 32 slots and included in the compressed code block sequence are continuously placed in one or more payload areas in the sequence of the payload areas in the sequence of the type-1 data code blocks in the data unit in the second code block stream. Optionally, in the example, some other code blocks, for example, a control code block, and a type-2 data code block, may be included between two adjacent type-1 data code blocks included in one data unit in the second code block stream. To be specific, the sequence of the payload areas in the sequence of the type-1 data code blocks does not include payload areas of other code blocks than the type-1 data code blocks. In the example, an example in which the to-be-processed code block sequence is placed in a payload area of a type-1 data code block is used for description. If the bits corresponding to the to-be-processed code block sequence may also be placed in a head code block, a tail code block, or the like, the sequence of the payload areas may be a sequence of payload areas including payload areas of all code blocks that are included in one data unit in the second code block stream and are used to carry the bits corresponding to the to-be-processed code block sequence.

As can be seen from FIG. 20, after a code block corresponding to each slot is obtained in this embodiment of this application, the code block is compressed. In the compressed code block sequence, a slot corresponding to each bit is the same as a corresponding slot in the to-be-processed code block sequence. For example, if the to-be-processed code block sequence uses 64B/66B coding, and the compressed code block sequence uses 64/65 bit coding, one 64B/66B code block in the to-be-processed code block sequence corresponds to a slot 2, and in the compressed code block sequence, a 64B/65B code block corresponding to the 64B/66B code block also corresponds to the slot 2. In other words, the slot 2 corresponds to one 64B/66B code block in the to-be-processed code block sequence, and corresponds to one 64B/65B code block in the compressed code block sequence.

A plurality of compression processing manners are available. For example, each code block in the to-be-processed sequence may be compressed separately. For example, a synchronization header area of each code block in the to-be-processed sequence is compressed from two bits into one bit. For example, "10" is compressed into "1", and "01" is compressed into "0". When a code block in the to-be-processed code block sequence uses 64B/66B coding, a coding form of the compressed code block sequence changes to 64/65 bit coding. A code block whose synchronization header area is "10" indicates that a type of the code block is a control type.

Figure 21:
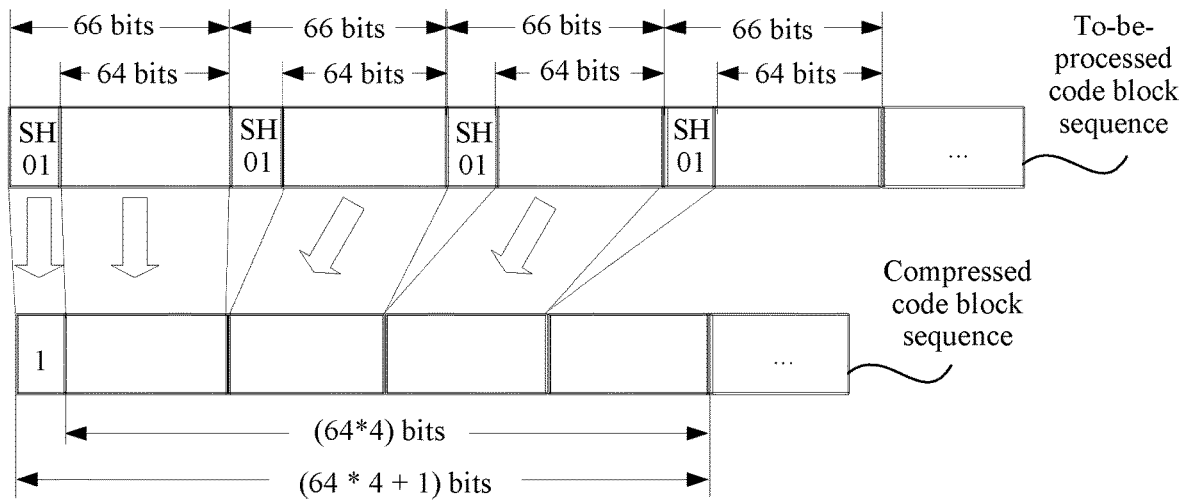
FIG. 21 is a schematic diagram of a compression processing manner according to an embodiment of this application.
Figure 22:
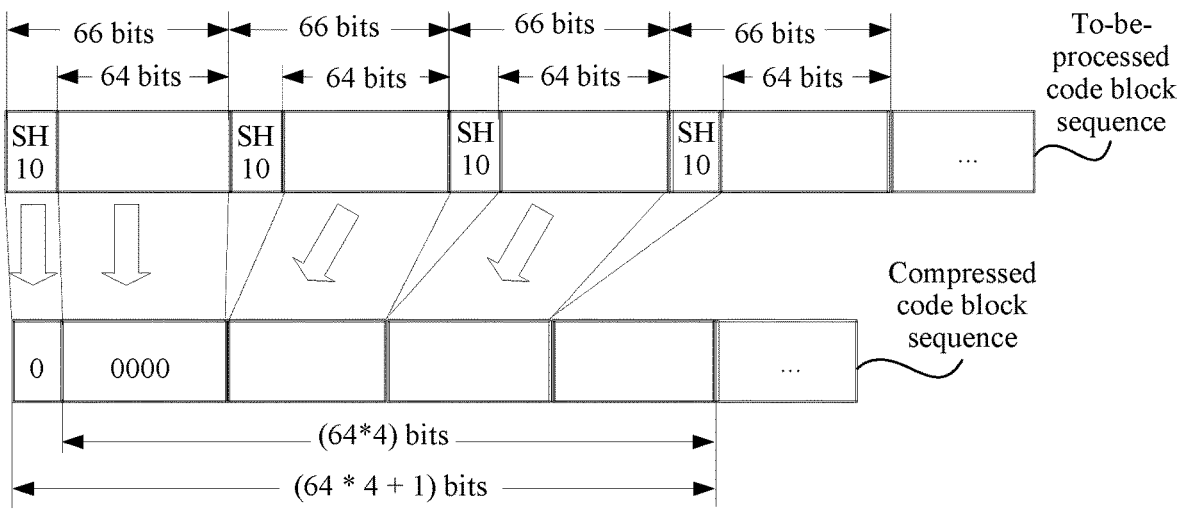
FIG. 22 is a schematic diagram of a compression processing manner according to an embodiment of this application.

In another optional compression processing manner, a type field of a code block of the control type widely used currently includes 0x1E, 0x2D, 0x33, 0x4B, 0x55, 0x66, 0x78, 0x87, 0x99, 0xAA, 0xB4, 0xCC, 0xD2, 0xE1, and 0xFF. Other numeric values such as 0x00 are reserved and not used. The type field of the code block occupies one byte. Therefore, the type field of the code block of the control type may be compressed from eighth bits into four bits. For example, "0x1E" is compressed into "0x1", and "0x2D" is compressed into "0x2". Therefore, a saved 4-bit space may be used for identifying a combination sequence of a plurality of code blocks. In this way, higher mapping efficiency can be achieved. In a typical example, in one of the compression processing manners, a plurality of continuous code blocks in the to-be-processed sequence may be compressed. For example, in an optional embodiment, four 64B/66B code blocks in the to-be-processed code block sequence may be converted into one 256B/257B code block in the compressed code block sequence. For example, a first bit is used to distinguish whether the 256B/257B code block includes a control block. For example, FIG. 21 is a schematic diagram of a compression processing manner according to an embodiment of this application. As shown in FIG. 21, if a first bit of the 256B/257B code block is 1, it indicates that the 256B/257B code block does not include a code block of the control type in the to-be-processed sequence, and includes only code blocks of the data type in the to-be-processed sequence. Therefore, synchronization headers of the four 64B/66B code blocks in the to-be-processed code block sequence, with eight bits in total, may be compressed into one bit. For example, FIG. 22 is a schematic diagram of a compression processing manner according to an embodiment of this application. As shown in FIG. 22, if a first bit of the 256B/257B code block is 0, it indicates that the 256B/257B code block includes at least one code block of the control type in the to-be-processed sequence. Next, four bits of a type field of a first 64B/66B code block included in the 256B/257B code block may be sequentially used to indicate four types of four 64B/66B code blocks from the to-be-processed code block sequence included in the 256B/257B code block. For example, if all the four types of the four 64B/66B code blocks from the to-be-processed code block sequence included in the 256B/257B code block are the control type, the four bits may be "0000" sequentially. Therefore, four synchronization header areas of the four 64B/66B code blocks from the to-be-processed code block sequence included in the 256B/257B code block may be compressed. To be specific, a saved 4-bit space of the type field of the code block may be used for identifying a combination sequence of a plurality of code blocks.

In an optional embodiment, R continuous code blocks in the to-be-processed code block sequence are compressed. If R is greater than 1, the R continuous code blocks include at least two code blocks, and two first code block streams from which two code blocks are obtained are two different first code block streams. In this optional embodiment, for example, as shown in the example in FIG. 21, R is 4. Therefore, when four continuous code blocks in the to-be-processed code block sequence are compressed, at least two code blocks exist in the four continuous code blocks. Two first code block streams corresponding to the two code blocks are different. For example, a first code block stream corresponding to one code block is the first code block stream 5201 in FIG. 18, and a first code block stream corresponding to the other code block is the first code block stream 5301 in FIG. 18.

In this embodiment of this application, a quantity of type-1 data code blocks included in one data unit in the second code block stream is not limited, and may be determined based on an actual situation. In an optional embodiment, because the to-be-processed code block sequence is compressed, to implement alignment of the second code block stream and the compressed code block sequence (that is, one data unit in the second code block stream may carry an integer number of code blocks in the compressed code block sequence, or each slot boundary and code block boundary may be determined from one data unit in the second code block stream), in a method for calculating a quantity of type-1 data code blocks included in one data unit in the second code block stream, calculation needs to be performed based on a coding mode of the compressed code block sequence. A specific calculation method is replacing a parameter in a coding form of the to-be-processed code block sequence in the foregoing calculation method with a parameter in a coding form of the compressed code block sequence. Specifically, the coding form of the compressed code block sequence is M3/N3, where M3 is a positive integer, and N3 is an integer not less than M3. Optionally, in a solution provided by this embodiment of this application, a quantity of type-1 data code blocks included in one data unit in the at least one data unit included in the second code block stream is determined based on M2 and a common multiple of N3 and M2. For example, a quantity of type-1 data code blocks included in one data unit is at least a quotient of the common multiple of N3 and M2 by M2. The quantity of type-1 data code blocks may be greater than the quotient of the common multiple of N3 and M2 by M2. A quantity of type-1 data code blocks in one data unit is an integer multiple of the quotient of the common multiple of N3 and M2 by M2. Alternatively, a quantity of type-1 data code blocks in one data unit included in the at least one data unit in the second code block stream is determined based on M2 and a least common multiple of and M2. For example, a quantity of type-1 data code blocks included in one data unit is at least a quotient of the least common multiple of N3 and M2 by M2; a quantity of type-1 data code blocks included in one data unit is greater than a quotient of the least common multiple of N3 and M2 by M2; or a quantity of type-1 data code blocks included in one data unit may be an integer multiple of a quotient of the least common multiple of N3 and M2 by M2. Optionally, with respect to data code blocks in this embodiment of this application, a defined type-1 data code block may be a data code block carrying a code block corresponding to each slot, and a type-2 data code block may be used to carry other information bits (for example, any one or more of slot allocation indication information, identifier indication information, and multiplexing indication information). A position of a type-2 data code block in a data unit may be fixed, or configured and then notified to the first communications device on the multiplexing side and the second communications device on the demultiplexing side.

In an optional embodiment, optionally, the second code block stream may carry multiplexing indication information, where the multiplexing indication information is used to indicate that a data unit carries a multiplexed code block. To be specific, the demultiplexing side needs to perform a demultiplexing operation after receiving the code block in the data unit. The multiplexing indication information may be carried in a data unit in the second code block stream, for example, carried in any one or more of a head code block, a type-2 data code block, and a tail code block. In this case, the multiplexing indication information may also indicate only that the data unit including the multiplexing indication information carries a multiplexed code block. In another optional embodiment, the multiplexing indication information may be carried on a code block between adjacent data units. For example, an O code block may be configured between adjacent data units, and the multiplexing indication information may be carried in a payload area of the O code block. In this case, after the multiplexing indication information is received, it may be determined that all code blocks carried in the data unit received after the multiplexing indication information are multiplexed code blocks, all of which need to be demultiplexed, until non-multiplexing indication information is received, where the non-multiplexing indication information may indicate that code blocks carried in a data unit after the non-multiplexing indication information do not need to be demultiplexed.

In the foregoing step 4101, in an optional embodiment, if a coding form of each of Q third data streams obtained from a low order pipe is not M1/N1 bit coding, code conversion may be performed on each of the Q third data streams to convert each third data stream into a first code block stream whose coding form is M1/N1 bit coding.

In a specific embodiment, the third data stream may be a synchronous digital hierarchy (SDH) service signal, and service mapping processing may be performed. For example, the third data stream may be encapsulated into a payload area of a data unit in the first code block stream, and then necessary encapsulation overheads, an OAM code block, and an idle code block are added, to obtain the first code block stream corresponding to the third data stream. Because a preset idle code block is added to the first code block stream, the first code block stream can be adapted to a pipe rate through addition or deletion of the idle code block. For example, a service signal of an SDH service with eight bytes D0 to D7 may be mapped to a payload area of a 64B/66B data code block, and a synchronization header '01' is added, so that the service signal with eight bytes D0 to D7 is converted into a form of a 64B/66B code block.

The following provides an example. For example, in the X-Ethernet/FlexE, a 5 Gbps granularity is used as a slot, that is, a bandwidth (which may also be referred to as a rate) of a slot is 5 Gbps, and one 5 Gbps slot is allocated to one second code block stream. A structural form of one data unit in the second code block stream is [1 head code block (the head code block may also be referred to as an overhead code block)+1023 data code blocks+1 idle code block]. As can be seen from the foregoing example, thirty-two 64B/66B code blocks (the 64B/66B code block may be a head code block, a tail code block, or a data code block) (if compression processing is performed, the thirty-two 64B/66B code blocks are a compressed code block sequence; or if compression processing is not performed, the thirty-two 64B/66B code blocks are a to-be-processed code block sequence; in this example, an example in which compression processing is not performed is used for description) can be completely loaded into payload areas of thirty-three 64B/66B data code blocks. One data unit in the second code block stream may include t*thirty-three 64B/66B data code blocks, where the t*thirty-three 64B/66B data code blocks are used to carry t*33*64=t*2112 bits. Based on 66 bits, a maximum of t*32 slots may be obtained through division based on TDM. This embodiment is described by using an example in which 31 slots are obtained through division when t=31. 31*33*64=31*32*66=65472. One data unit in the second code block stream may include 31*33=1023 type-1 data code blocks.

When 31 slots are obtained through division, 5000000000*(16383/16384)*(20460/20461)*(1023/1025)*(1/31)=160.9579176 Mbps (−100 ppm: 160.9418218 Mbps). 5G is a nominal rate of a slot, that is, a bit rate in 64B/66B coding exclusive of a synchronization header. A total bit rate of an encoded 5G signal inclusive of a 64B/66B synchronization header further needs to be increased by 66/64=3.125%; 16383/16384 is an effective bandwidth of a 100GE Ethernet interface exclusive of an alignment codeword of an alignment marker (AM); 20460/20461 indicates an effective information bandwidth exclusive of overheads of a flexible Ethernet interface; 1023/1025 indicates a proportion of remaining data code blocks exclusive of high order data unit encapsulation overheads and necessary idle code blocks; and 1/31 indicates an effective bearer bandwidth of a slot after the 31 slots are obtained through division. To be specific, a bandwidth of one slot obtained through division and used for forming a bandwidth of a low order pipe is 160.95791767 Mbps (considering an actual situation of a project, an operating clock frequency of a component or a device may deviate by −100 ppm, and a total bandwidth of a smallest available low order pipe bearer is 160.9418218 Mbps).

The following describes an SDH STM-1 signal. For the service signal, we need to encapsulate and map the service signal to a low order data unit. A native bandwidth/rate of the SDH STM-1 is 155.52 Mbps. We encapsulate the signal in a manner consistent with that of a high order data unit. To be specific, the SDH STM-1 signal is loaded into a payload area of a 64B/66B data code block of the low order data unit, and then an overhead code block and a necessary idle code block are encapsulated in the low order data unit. In this case, a corresponding bandwidth of a data stream of the low order data unit with the idle code block is as follows: 155.52*(66/64)*(1025/1023)=160.6935484 Mbps. Optionally, considering an actual situation of a project, an operating clock frequency of a component or a device may deviate positively by several ppm, depending on a specific service signal, for example, by +100 ppm or +20 ppm. For example, a large frequency deviation applicable to an Ethernet, that is, +100 ppm, is used for calculation. A maximum bandwidth of the encapsulated SDH STM-1 is 160.7096177 Mbps. Actually, a frequency deviation allowed by an optical transport network (OTN) is +/−20 ppm. A frequency deviation allowed by the synchronous digital hierarchy (SDH) is less than the foregoing two frequency deviations, and is +/−4.6 ppm in a case of synchronization.

A bandwidth of 160.9579176 Mbps (−100 ppm: 160.9418218 Mbps) is higher than a bandwidth of 160.6935484 Mbps (+100 ppm: 160.7096177 Mbps). Even if an extreme case is considered, a rate of a low order bearer pipe deviates negatively by 100 ppm, and a service signal deviates positively by 100 ppm. Therefore, after the SDH STM-1 service signal is encapsulated, by using a padding function of adding an idle code block based on a requirement, the encapsulated SDH STM-1 signal can be transmitted in a low order pipe.

Finally, it should be noted that, based on same encapsulation and overheads, one 5G slot corresponds to one X-Ethernet high order pipe, and may be divided into 31 slots, where each slot may correspond to one low order pipe and may transmit one encapsulated SDH STM-1 service. Because a rate of the STM-N is N times that of the STM-1, after service signals of the STM-4, the STM-16, or the like are encapsulated transparently in the same manner, the service signals may be carried by using a low order bearer pipe formed by the N slots. A case of an OTN signal is similar to that of an SDH signal, except for a rate difference. Given a service bandwidth requirement, an appropriate quantity of slots may be allocated, so that a bandwidth of a low order bearer pipe is always higher than or equal to a bandwidth after service signal encapsulation, and an operation of adding or deleting an idle code block is performed to implement rate padding adaptation.

Figure 23:
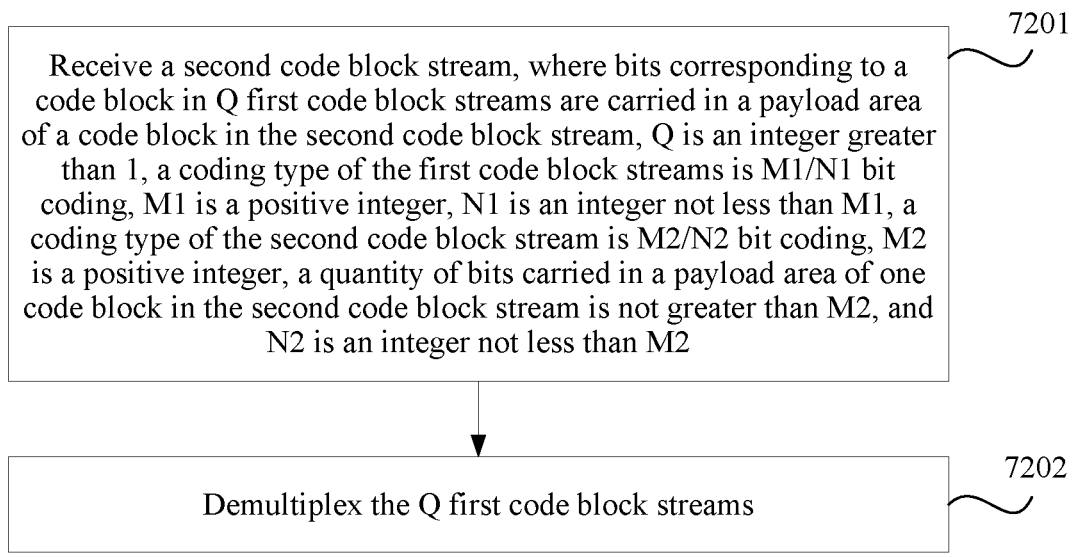
FIG. 23 is a schematic flowchart of a data transmission method according to an embodiment of this application.

Based on the foregoing solution performed by the first communications device on the multiplexing side and the same idea, an embodiment of this application further provides a data transmission method, that is, a method performed by the second communications device on the demultiplexing side of the data transmission method. For example, FIG. 23 is a schematic flowchart of a data transmission method according to an embodiment of this application. As shown in FIG. 23, the method includes the following steps.

Step 7201: Receive a second code block stream, where bits corresponding to a code block in Q first code block streams are carried in a payload area of a code block in the second code block stream, Q is an integer greater than 1, a coding type of the first code block streams is M1/N1 bit coding, M1 is a positive integer, N1 is an integer not less than M1, a coding type of the second code block stream is M2/N2 bit coding, M2 is a positive integer, a quantity of bits carried in a payload area of one code block in the second code block stream is not greater than M2, and N2 is an integer not less than M2.

Step 7202: Demultiplex the Q first code block streams.

To be specific, when receiving the second code block stream, a second communications device on a demultiplexing side may obtain, from the second code block stream, code blocks corresponding to the Q first code block streams carried in the second code block stream, and further determine a first code block stream corresponding to each code block, to restore each first code block stream.

In an optional embodiment, if a first communications device on a multiplexing side performs the method shown in FIG. 19, and a to-be-processed code block sequence is not compressed, in an optional embodiment, bits corresponding to the code blocks in the Q first code block streams carried in the payload area of the second code block stream are obtained, so that a to-be-decompressed code block sequence is obtained; and the Q first code block streams are demultiplexed.

To be specific, a code block corresponding to each slot may be obtained from a payload area of a type-1 data code block in the second code block stream, so that the to-be-decompressed code block sequence is obtained. Then an order of the to-be-decompressed code block sequence may correspond to an order of slots. For example, 32 slots in total are obtained through division. The second communications device on the demultiplexing side knows a position of a type-1 data code block carrying a code block corresponding to a slot (which may be configured in advance, or sent by a centralized control unit or a management unit to the second communications device on the demultiplexing side, or sent by the first communications device on the multiplexing side to the second communications device on the demultiplexing side). In a to-be-decompressed code block sequence including code blocks corresponding to all slots and obtained from one data unit in the second code block stream, ordering is performed sequentially, for example, a first code block corresponds to a slot 0, a second code block corresponds to a slot 1, a third code block corresponds to a slot 2, and so on, until a code block corresponding to a slot 31 is arranged, and then a next code block is determined as a code block corresponding to the slot 0 again, and a subsequent second code block is determined as a code block corresponding to the slot 1.

Further, the second communications device on the demultiplexing side obtains an identifier of a slot corresponding to each of the Q first code block streams, that is, obtains a correspondence between the Q first code block streams and slots. For example, if the slot 0 is allocated to a first code block stream, all code blocks in a to-be-decompressed code block sequence corresponding to the slot 0 are determined as code blocks in the first code block stream, and the first code block stream is restored.

In another optional embodiment, if a first communications device on a multiplexing side performs the method shown in FIG. 20, and a to-be-processed code block sequence is compressed, in an optional embodiment, a code block corresponding to each slot may be obtained from a payload area of a type-1 data code block in the second code block stream, so that a to-be-decompressed code block sequence is obtained. The to-be-decompressed code block sequence is decompressed, so that a to-be-restored code block sequence is obtained; and a first code block stream corresponding to each code block in the to-be-restored code block sequence is determined based on the to-be-restored code block sequence, so that the Q first code block streams are obtained, where each of the Q first code block streams corresponds to at least one slot, and an order of code blocks included in the to-be-restored code block sequence matches an order of slots corresponding to the code blocks included in the to-be-restored code block sequence.

Then an order of the to-be-restored code block sequence may correspond to an order of slots. For example, 32 slots in total are obtained through division. The second communications device on the demultiplexing side knows a position of a type-1 data code block carrying a code block corresponding to a slot (which may be configured in advance, or sent by a centralized control unit or a management unit to the second communications device on the demultiplexing side, or sent by the first communications device on the multiplexing side to the second communications device on the demultiplexing side). In a to-be-restored code block sequence including code blocks corresponding to all slots and obtained from one data unit in the second code block stream, ordering is performed sequentially, for example, a first code block corresponds to a slot 0, a second code block corresponds to a slot 1, a third code block corresponds to a slot 2, and so on, until a code block corresponding to a slot 31 is arranged, and then a next code block is determined as a code block corresponding to the slot 0 again, and a subsequent second code block is determined as a code block corresponding to the slot 1.

Further, the second communications device on the demultiplexing side obtains an identifier of a slot corresponding to each of the Q first code block streams, that is, obtains a correspondence between the Q first code block streams and slots. For example, if the slot 0 is allocated to a first code block stream, all code blocks in a to-be-restored code block sequence corresponding to the slot 0 are determined as code blocks in the first code block stream, and the first code block stream is restored.

Optionally, if a compressed code block sequence uses 64/65 bit coding, and a to-be-processed code block sequence uses 64B/66B coding, in a specific embodiment, the second communications device on the demultiplexing side may obtain boundary information of a data unit in the second code block stream, for example, boundary information of an idle code block in the second code block stream, a boundary of a head code block (the head code block may also be referred to as an overhead code block) of a data unit, and boundary information of a payload area of a type-1 data code block. Therefore, each 64B/65B code block may be delimited based on 65 bits every time starting from a first bit of a first type-1 data code block in one data unit in the second code block stream, where the delimited 64B/65B code block is a code block in the to-be-decompressed code block sequence. Then code blocks in the to-be-decompressed code block sequence may be decompressed based on information of the first bit, so that 64B/65B code blocks in the to-be-restored code block sequence are restored.

Figure 24:
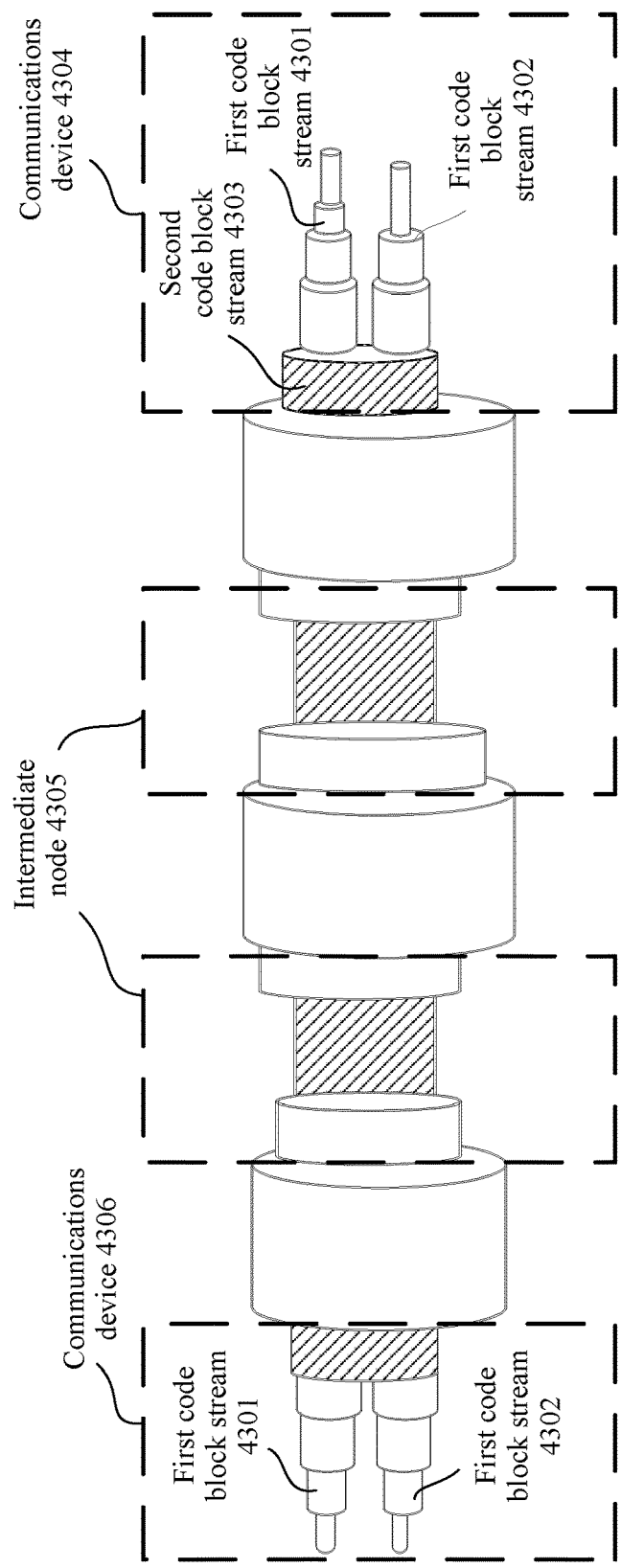
FIG. 24 is a schematic structural diagram of data transmission according to an embodiment of this application.

For example, FIG. 24 is a schematic structural diagram of data transmission according to an embodiment of this application. As shown in FIG. 24, if a first communications device 4304 is on a multiplexing side, and a communications device 4306 is on a demultiplexing side, the first communications device 4304 multiplexes a first code block stream 4301 and a second code block stream 4302 into a second code block stream 4303, so that the second code block stream is transmitted between at least one intermediate node 4305 (two intermediate nodes 4305 are shown in the figure, and a communications device between the first communications device on the multiplexing side and the second communications device on the demultiplexing side may be referred to as an intermediate node). The second communications device 4306 demultiplexes the received second code block stream to obtain the first code block stream 4301 and the first code block stream 4302.

With reference to the foregoing content and FIG. 24, it can be seen that, the solution provided by this embodiment of this application resolves a problem of multiplexing a plurality of service signals into one service signal based on a code block stream (64B/66B coding) for transmission, for example, multiplexing a plurality of service signals into one 64B/66B service signal. Performing cross-connections and scheduling in a network based on one 64B/66B service signal can simplify network operation and maintenance and a data plane in X-Ethernet and SPN technologies. Therefore, the X-Ethernet and SPN technologies can be improved, so that the two technologies can be applied to a backbone network and a long distance network. In the solution provided by this embodiment of this application, on an ingress device and an egress device of the second code block stream, at least two low order pipes carrying two first code block streams are further provided in a high order pipe carrying the second code block stream, and service mapping and demapping are performed on the low order pipes separately. During switching, an intermediate node (a communications device between the first communications device on the multiplexing side and the second communications device on the demultiplexing side may be referred to as an intermediate node) needs to process only the higher order pipe, without processing the low order pipes. Therefore, convergence of a quantity of pipes can be implemented, and cross-processing of the intermediate node can be simplified. Optionally encoding and compressing signals in a low order pipe can improve multiplexing efficiency. Because an S code block and a T code block are encapsulated in a data unit carried in a high order pipe, compatibility with a conventional network and the prior approach can be achieved effectively, so that a multiplexed high order pipe can traverse an existing network node and network supporting flat networking, and that the data unit can have good forward compatibility and backward compatibility.

Figure 25:
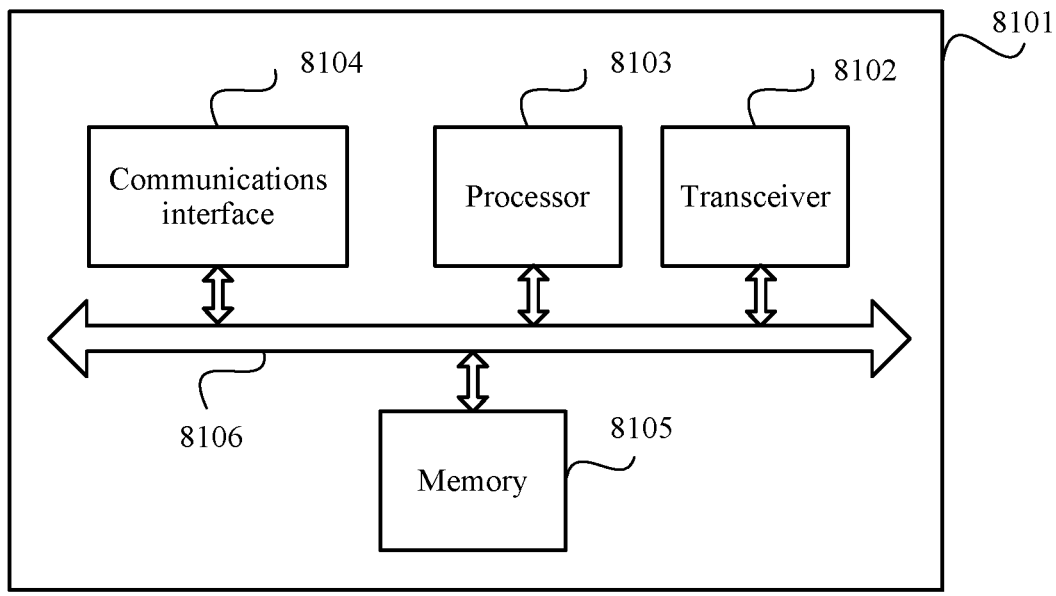
FIG. 25 is a schematic structural diagram of a communications device according to an embodiment of this application.

Based on the foregoing content and the same idea, this application provides a communications device 8101, configured to perform any solution on the multiplexing side in the foregoing method. For example, FIG. 25 is a schematic structural diagram of a communications device according to this application. As shown in FIG. 25, a communications device 8101 includes a processor 8103, a transceiver 8102, a memory 8105, and a communications interface 8104, where the processor 8103, the transceiver 8102, the memory 8105, and the communications interface 8104 are interconnected by using a bus 8106. The communications device 8101 in this example may be the first communications device in the foregoing content, and may perform the corresponding solution in FIG. 7. The communications device 8101 may be the communications device 3105 in FIG. 4 and FIG. 5, or may be the communications device 3107.

The bus 8106 may be a peripheral component interconnect (PCI) bus, an extended industry standard architecture (EISA) bus, or the like. The bus may be classified into an address bus, a data bus, a control bus, and the like. For ease of representation, only one thick line is used to represent the bus in FIG. 25, but this does not mean that there is only one bus or only one type of bus.

The memory 8105 may include a volatile memory, for example, a random access memory (RAM). The memory may also include a non-volatile memory, for example, a flash memory, a hard disk drive (HDD), or a solid-state drive (SSD). The memory 8105 may further include a combination of the foregoing types of memories.

The communications interface 8104 may be a wired communications interface, a wireless communications interface, or a combination thereof, where the wired communications interface may be, for example, an Ethernet interface. The Ethernet interface may be an optical interface, an electrical interface, or a combination thereof. The wireless communications interface may be a WLAN interface.

The processor 8103 may be a central processing unit (CPU), a network processor (NP), or a combination of a CPU and an NP. The processor 8103 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

Optionally, the memory 8105 may be further configured to store a program instruction; and the processor 8103 may invoke the program instruction stored in the memory 8105 to perform one or more steps in the embodiment shown in the foregoing solution or an optional embodiment, so that the communications device 8101 implements the function of the communications device in the foregoing method.

The processor 8103 is configured to: execute the instruction stored by the memory, and control the transceiver 8102 to receive a signal and send a signal; when the processor 8103 executes the instruction stored by the memory, the processor 8103 in the communications device 8101 is configured to: obtain Q first code block streams, where Q is an integer greater than 1, a coding type of the first code block streams is M1/N1 bit coding, M1 is a positive integer, and N1 is an integer not less than M1; and place, in a to-be-sent second code block stream, bits corresponding to code blocks in the Q first code block streams, where a coding type of the second code block stream is M2/N2 bit coding, bits corresponding to a code block in the Q first code block streams are carried in a payload area of a code block in the second code block stream, M2 is a positive integer, a quantity of bits carried in a payload area of one code block in the second code block stream is not greater than M2, and N2 is an integer not less than M2; and the transceiver 8102 is configured to send the second code block stream.

In an optional embodiment, the processor 8103 is configured to perform code-block-based time division multiplexing on the code blocks in the Q first code block streams to obtain a to-be-processed code block sequence, where each of the Q first code block streams corresponds to at least one slot, and an order of code blocks included in the to-be-processed code block sequence matches an order of slots corresponding to the code blocks included in the to-be-processed code block sequence; and place, in the to-be-sent second code block stream, bits corresponding to the to-be-processed code block sequence.

In an optional embodiment, the processor 8103 is configured to: compress R continuous code blocks in the to-be-processed code block sequence to obtain a compressed code block sequence, where R is a positive integer; and place, in the to-be-sent second code block stream, bits corresponding to the compressed code block sequence.

In an optional embodiment, if R is greater than 1, the R continuous code blocks include at least two code blocks, and two first code block streams from which two code blocks are obtained are two different first code block streams.

In an optional embodiment, the processor 8103 is further configured to: for a first code block stream in the Q first code block streams, perform addition or deletion processing of an idle code block on the first code block stream based on a bandwidth of the first code block stream and a total bandwidth of slots corresponding to the first code block stream, where the total bandwidth of slots corresponding to the first code block stream is determined based on a quantity of slots corresponding to the first code block stream and a bandwidth allocated to each slot corresponding to the first code block stream.

The second code block stream in this embodiment of this application may have a plurality of data structures. For a specific example, refer to the foregoing embodiment. Details are not described again herein.

In this embodiment of this application, other information carried in the second code block stream, for example, identifier indication information, slot allocation indication information, and multiplexing indication information, refer to the content in the foregoing embodiment. Details are not described again herein.

In this embodiment of this application, for a manner of placing, in the second code block stream, a code block obtained from the first code block stream, and a solution to determining a quantity of type-1 data code blocks included in a data unit in the second code block stream, refer to the foregoing embodiment. Details are not described again herein.

Figure 26:
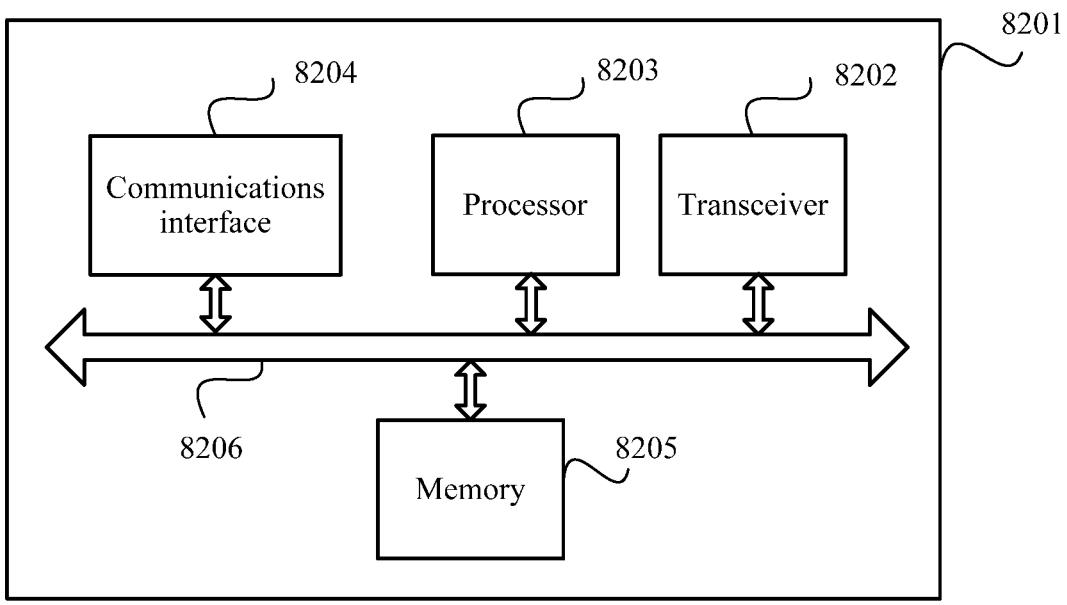
FIG. 26 is a schematic structural diagram of another communications device according to an embodiment of this application.

Based on the same idea, this application provides a communications device 8201, configured to perform any solution on the demultiplexing side in the foregoing method. For example, FIG. 26 is a schematic structural diagram of a communications device according to this application. As shown in FIG. 26, a communications device 8201 includes a processor 8203, a transceiver 8202, a memory 8205, and a communications interface 8204, where the processor 8203, the transceiver 8202, the memory 8205, and the communications interface 8204 are interconnected by using a bus 8206. The communications device 8201 in this example may be the second communications device in the foregoing content, and may perform the corresponding solution in FIG. 23. The communications device 8201 may be the communications device 3109 in FIG. 4, or may be the communications device 3109 in FIG. 5, or may be the communications device 3115 in FIG. 5.

The bus 8206 may be a peripheral component interconnect (PCI) bus, an extended industry standard architecture (EISA) bus, or the like. The bus may be classified into an address bus, a data bus, a control bus, and the like. For ease of representation, only one thick line is used to represent the bus in FIG. 26, but this does not mean that there is only one bus or only one type of bus.

The memory 8205 may include a volatile memory, for example, a random access memory (RAM). The memory may also include a non-volatile memory, for example, a flash memory, a hard disk drive (HDD), or a solid-state drive (SSD). The memory 8205 may further include a combination of the foregoing types of memories.

The communications interface 8204 may be a wired communications interface, a wireless communications interface, or a combination thereof, where the wired communications interface may be, for example, an Ethernet interface. The Ethernet interface may be an optical interface, an electrical interface, or a combination thereof. The wireless communications interface may be a WLAN interface.

The processor 8203 may be a central processing unit (CPU), a network processor (NP), or a combination of a CPU and an NP. The processor 8203 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

Optionally, the memory 8205 may be further configured to store a program instruction; and the processor 8203 may invoke the program instruction stored in the memory 8205 to perform one or more steps in the embodiment shown in the foregoing solution or an optional embodiment, so that the communications device 8201 implements the function of the communications device in the foregoing method.

The processor 8203 is configured to: execute the instruction stored by the memory, and control the transceiver 8202 to receive a signal and send a signal; when the processor 8203 executes the instruction stored by the memory, the transceiver 8202 in the communications device 8201 is configured to receive a second code block stream, where bits corresponding to a code block in Q first code block streams are carried in a payload area of a code block in the second code block stream, Q is an integer greater than 1, a coding type of the first code block streams is M1/N1 bit coding, M1 is a positive integer, N1 is an integer not less than M1, a coding type of the second code block stream is M2/N2 bit coding, M2 is a positive integer, a quantity of bits carried in a payload area of one code block in the second code block stream is not greater than M2, and N2 is an integer not less than M2; and the processor 8203 is configured to demultiplex the Q first code block streams.

In an optional embodiment, the processor 8203 is configured to obtain bits corresponding to code blocks in the Q first code block streams carried in the payload area of the second code block stream, to obtain a to-be-decompressed code block sequence; and demultiplex the Q first code block streams based on the to-be-decompressed code block sequence.

In an optional embodiment, if one code block in the to-be-decompressed code block sequence is obtained by compressing at least two code blocks, the at least two code blocks correspond to two different first code block streams.

In an optional embodiment, the processor 8203 is configured to: decompress the to-be-decompressed code block sequence to obtain a to-be-restored code block sequence; and determine, based on the to-be-restored code block sequence, a first code block stream corresponding to each code block in the to-be-restored code block sequence, to obtain the Q first code block streams, where each of the Q first code block streams corresponds to at least one slot, and an order of code blocks included in the to-be-restored code block sequence matches an order of slots corresponding to the code blocks included in the to-be-restored code block sequence.

The second code block stream in this embodiment of this application may have a plurality of data structures. For a specific example, refer to the foregoing embodiment. Details are not described again herein.

In this embodiment of this application, other information carried in the second code block stream, for example, identifier indication information, slot allocation indication information, and multiplexing indication information, refer to the content in the foregoing embodiment. Details are not described again herein.

In this embodiment of this application, for a manner of placing, in the second code block stream, a code block obtained from the first code block stream, and a solution to determining a quantity of type-1 data code blocks included in a data unit in the second code block stream, refer to the foregoing embodiment. Details are not described again herein.

Figure 27:
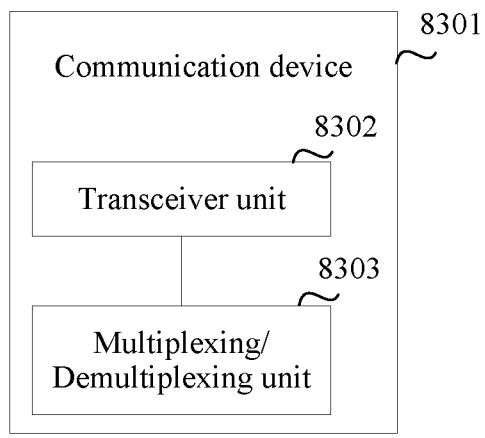
FIG. 27 is a schematic structural diagram of another communications device according to an embodiment of this application.

Based on the same idea, an embodiment of this application provides a communications device, configured to perform any solution on the multiplexing side in the foregoing method procedure. For example, FIG. 27 is a schematic structural diagram of a communications device according to an embodiment of this application. As shown in FIG. 27, a communications device 8301 includes a transceiver unit 8302 and a multiplexing/demultiplexing unit 8303. The communications device 8301 in this example may be the first communications device in the foregoing content, and may perform the corresponding solution in FIG. 7. The communications device 8301 may be the communications device 3105 in FIG. 4 and FIG. 5, or may be the communications device 3107.

The multiplexing/demultiplexing unit 8303 is configured to obtain Q first code block streams, where Q is an integer greater than 1, a coding type of the first code block streams is M1/N1 bit coding, M1 is a positive integer, and N1 is an integer not less than M1; and placing, in a to-be-sent second code block stream, bits corresponding to code blocks in the Q first code block streams, where a coding type of the second code block stream is M2/N2 bit coding, bits corresponding to a code block in the Q first code block streams are carried in a payload area of a code block in the second code block stream, M2 is a positive integer, a quantity of bits carried in a payload area of one code block in the second code block stream is not greater than M2, and N2 is an integer not less than M2; and the transceiver unit 8302 is configured to send the second code block stream.

In this embodiment of this application, the transceiver unit 8302 may be implemented by the transceiver 8102 in FIG. 25, and the multiplexing/demultiplexing unit 8303 may be implemented by the processor 8103 in FIG. 25. To be specific, the transceiver unit 8302 in this embodiment of this application may perform the solution performed by the transceiver 8102 in FIG. 25. The multiplexing/demultiplexing unit 8303 in this embodiment of this application may perform the solution performed by the processor 8103 in FIG. 25. For other content, refer to the foregoing content. Details are not described again herein.

It should be understood that, division of units of the first communications device and the second communications device is merely logical function division. The units may be all or partially integrated in a physical entity or may be separated physically in an actual embodiment. In this embodiment of this application, the transceiver unit 8302 may be implemented by the transceiver 8102 in FIG. 25, and the multiplexing/demultiplexing unit 8303 may be implemented by the processor 8103 in FIG. 25. As shown in FIG. 25, the memory 8105 included in the communications device 8101 may be configured to store code when the processor 8103 included in the communications device 8101 performs a solution, where the code may be a program/code preinstalled before delivery of the communications device 8101.

Figure 28:
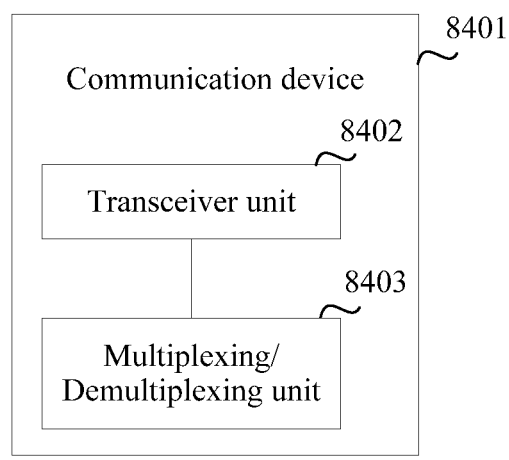
FIG. 28 is a schematic structural diagram of another communications device according to an embodiment of this application.

Based on the same idea, an embodiment of this application provides a communications device, configured to perform any solution on the demultiplexing side in the foregoing method procedure. For example, FIG. 28 is a schematic structural diagram of a communications device according to an embodiment of this application. As shown in FIG. 28, a communications device 8401 includes a transceiver unit 8402 and a multiplexing/demultiplexing unit 8403. The communications device 8401 in this example may be the second communications device in the foregoing content, and may perform the corresponding solution in FIG. 23. The communications device 8401 may be the communications device 3109 in FIG. 4, or may be the communications device 3109 in FIG. 5, or may be the communications device 3115 in FIG. 5.

The transceiver unit 8402 is configured to receive a second code block stream, where bits corresponding to a code block in Q first code block streams are carried in a payload area of a code block in the second code block stream, Q is an integer greater than 1, a coding type of the first code block streams is M1/N1 bit coding, M1 is a positive integer, N1 is an integer not less than M1, a coding type of the second code block stream is M2/N2 bit coding, M2 is a positive integer, a quantity of bits carried in a payload area of one code block in the second code block stream is not greater than M2, and N2 is an integer not less than M2; and the multiplexing/demultiplexing unit 8403 is configured to demultiplex the Q first code block streams.

In this embodiment of this application, the transceiver unit 8402 may be implemented by the transceiver 8202 in FIG. 26, and the multiplexing/demultiplexing unit 8403 may be implemented by the processor 8203 in FIG. 26. To be specific, the transceiver unit 8402 in this embodiment of this application may perform the solution performed by the transceiver 8202 in FIG. 26. The multiplexing/demultiplexing unit 8403 in this embodiment of this application may perform the solution performed by the processor 8203 in FIG. 26. For other content, refer to the foregoing content. Details are not described again herein.

It should be understood that, division of units of the first communications device and the second communications device is merely logical function division. The units may be all or partially integrated in a physical entity or may be separated physically in an actual embodiment. In this embodiment of this application, the transceiver unit 8402 may be implemented by the transceiver 8202 in FIG. 26, and the multiplexing/demultiplexing unit 8403 may be implemented by the processor 8203 in FIG. 26. As shown in FIG. 26, the memory 8205 included in the communications device 8201 may be configured to store code when the processor 8203 included in the communications device 8201 performs a solution, where the code may be a program/code preinstalled before delivery of the communications device 8201.

The foregoing embodiment may be implemented in a form of software, hardware, firmware, or any combination thereof completely or partially. When the foregoing embodiment is implemented by using a software program, the foregoing embodiment may be implemented in a form of a computer program product completely or partially. The computer program product includes one or more instructions. When the computer program instructions are loaded and executed on a computer, the procedure or functions according to the embodiments of this application are all or partially generated. The computer may be a general-purpose computer, a dedicated computer, a computer network, or other programmable apparatuses. The instructions may be stored in a computer storage medium or may be transmitted from a computer storage medium to another computer-readable storage medium. For example, the instructions may be transmitted from a web site, computer, server, or data center to another website, computer, server, or data center in a wired (for example, a coaxial cable, an optical fiber, or a digital subscriber line (DSL)) or wireless (for example, infrared, radio, or microwave) manner. The computer storage medium may be any usable medium accessible by a computer, or a data storage device, such as a server or a data center, integrating one or more usable media. The usable medium may be a magnetic medium (for example, a floppy disk, a hard disk, a magnetic tape, or a magneto-optical disk (MO)), an optical medium (for example, a CD, a DVD, a BD, or an HVD), a semiconductor medium (for example, a ROM, an EPROM, an EEPROM, a non-volatile memory (NAND FLASH), a solid state disk (SSD)), or the like.

A person skilled in the art should understand that the embodiments of this application may be provided as a method, a system, or a computer program product. Therefore, the embodiments of this application may use a form of hardware only embodiments, software only embodiments, or embodiments with a combination of software and hardware. Moreover, the embodiments of this application may use a form of a computer program product that is implemented on one or more computer-usable storage media (including but not limited to a disk memory, a CD-ROM, an optical memory, and the like) that include computer-usable program code.

The embodiments of this application are described with reference to the flowcharts and/or block diagrams of the method, the device (system), and the computer program product according to the embodiments of this application. It should be understood that instructions may be used to implement each process and/or each block in the flowcharts and/or the block diagrams and a combination of a process and/or a block in the flowcharts and/or the block diagrams. These instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, a person skilled in the art can make various modifications and variations to the embodiments of this application without departing from the spirit and scope of this application. This application is intended to cover these modifications and variations provided that they fall within the scope of protection defined by the following claims and their equivalent technologies.

What is claimed is:

1. A data transmission method, comprising:
obtaining Q first code block streams from Q different communications devices, wherein Q is an integer greater than 1, a coding type of the first code block streams is M1/N1 bit coding, M1 is a positive integer, and N1 is an integer not less than M1; and
placing, in a to-be-sent second code block stream that combines the Q first code block streams into a single code block stream, bits corresponding to code blocks in the Q first code block streams, wherein a coding type of the second code block stream is M2/N2 bit coding, bits corresponding to a code block in the Q first code block streams are carried in a payload area of a code block in the second code block stream, M2 is a positive integer, a quantity of bits carried in a payload area of one code block in the second code block stream is not greater than M2, N2 is an integer not less than M2.

2. The method according to claim 1, wherein the second code block stream corresponds to at least one data unit;
one data unit in the at least one data unit comprises a head code block and at least one data code block, or one data unit in the at least one data unit comprises a head code block, at least one data code block, and a tail code block, or one data unit in the at least one data unit comprises at least one data code block and a tail code block; and
the at least one data code block comprises at least one type-1 data code block, the bits corresponding to the code block in the Q first code block streams are carried in a payload area of a type-1 data code block in the at least one type-1 data code block in the second code block stream, and a quantity of bits carried in a payload area of one type-1 data code block in the second code block stream is M2.

3. The method according to claim 2, wherein the head code block is an S code block and/or the tail code block is a T code block.

4. The method according to claim 2, wherein the placing, in the to-be-sent second code block stream, bits corresponding to code blocks in the Q first code block streams comprises:
performing code-block-based time division multiplexing on the code blocks in the Q first code block streams to obtain a to-be-processed code block sequence, wherein each of the Q first code block streams corresponds to at least one slot, and an order of code blocks comprised in the to-be-processed code block sequence matches an order of slots corresponding to the code blocks comprised in the to-be-processed code block sequence; and
placing, in the to-be-sent second code block stream, bits corresponding to the to-be-processed code block sequence.

5. The method according to claim 4, wherein slot allocation indication information is carried in a preset code block in the second code block stream; and
the slot allocation indication information indicates a correspondence between the Q first code block streams and slots.

6. The method according to claim 4, wherein the placing, in the to-be-sent second code block stream, bits corresponding to the to-be-processed code block sequence comprises:
compressing R continuous code blocks in the to-be-processed code block sequence to obtain a compressed code block sequence, wherein R is a positive integer; and
placing, in the to-be-sent second code block stream, bits corresponding to the compressed code block sequence.

7. The method according to claim 5, wherein a coding form of the compressed code block sequence is M3/N3, M3 is a positive integer, and N3 is an integer not less than M3; and
a quantity of type-1 data code blocks comprised in one data unit in the at least one data unit comprised in the second code block stream is determined based on M2 and a common multiple of N3 and M2, or a quantity of type-1 data code blocks comprised in one data unit in the at least one data unit comprised in the second code block stream is determined based on M2 and a least common multiple of N3 and M2.

8. A data transmission method, comprising:
receiving a second code block stream, wherein bits corresponding to a code block in Q first code block streams from Q different communications devices are carried in a payload area of a code block in the second code block stream that combines the Q first code block streams into a single code block stream, Q is an integer greater than 1, a coding type of the first code block streams is M1/N1 bit coding, M1 is a positive integer, N1 is an integer not less than M1, a coding type of the second code block stream is M2/N2 bit coding, M2 is a positive integer, a quantity of bits carried in a payload area of one code block in the second code block stream is not greater than M2, and N2 is an integer not less than M2; and demultiplexing the Q first code block streams.

9. The method according to claim 8, wherein the second code block stream corresponds to at least one data unit;

one data unit in the at least one data unit comprises a head code block and at least one data code block, or one data unit in the at least one data unit comprises a head code block, at least one data code block, and a tail code block, or one data unit in the at least one data unit comprises at least one data code block and a tail code block; and the at least one data code block comprises at least one type-1 data code block, the bits corresponding to the code block in the Q first code block streams are carried in a payload area of a type-1 data code block in the at least one type-1 data code block in the second code block stream, and a quantity of bits carried in a payload area of one type-1 data code block in the second code block stream is M2.

10. The method according to claim 9, wherein the head code block is an S code block and/or the tail code block is a T code block.

11. The method according to claim 9, wherein the demultiplexing the Q first code block streams comprises:

obtaining bits corresponding to code blocks in the Q first code block streams carried in the payload area of the second code block stream, to obtain a to-be-decompressed code block sequence; and demultiplexing the Q first code block streams based on the to-be-decompressed code block sequence.

12. The method according to claim 10, wherein slot allocation indication information is carried in a preset code block in the second code block stream; and the slot allocation indication information indicates a correspondence between the Q first code block streams and slots.

13. The method according to claim 11, wherein the demultiplexing the Q first code block streams based on the to-be-decompressed code block sequence comprises:

decompressing the to-be-decompressed code block sequence to obtain a to-be-restored code block sequence; and determining, based on the to-be-restored code block sequence, a first code block stream corresponding to each code block in the to-be-restored code block sequence, to obtain the Q first code block streams, wherein each of the Q first code block streams corresponds to at least one slot, and an order of code blocks comprised in the to-be-restored code block sequence matches an order of slots corresponding to the code blocks comprised in the to-be-restored code block sequence.

14. The method according to claim 11, wherein a coding form of the to-be-decompressed code block sequence is M3/N3, M3 is a positive integer, and N3 is an integer not less than M3; and a quantity of type-1 data code blocks comprised in one data unit in the at least one data unit comprised in the second code block stream is determined based on M2 and a common multiple of N3 and M2, or a quantity of type-1 data code blocks comprised in one data unit in the at least one data unit comprised in the second code block stream is determined based on M2 and a least common multiple of N3 and M2.

15. A communications device, comprising:

a processor configured to:

obtain Q first code block streams from Q different communication devices, wherein Q is an integer greater than 1, a coding type of the first code block streams is M1/N1 bit coding, M1 is a positive integer, and N1 is an integer not less than M1, and place, in a to-be-sent second code block stream that combines the Q first code block streams into a single code block stream, bits corresponding to code blocks in the Q first code block streams, wherein a coding type of the second code block stream is M2/N2 bit coding, bits corresponding to a code block in the Q first code block streams are carried in a payload area of a code block in the second code block stream, M2 is a positive integer, a quantity of bits carried in a payload area of one code block in the second code block stream is not greater than M2, and N2 is an integer not less than M2; and a transceiver configured to send the second code block stream.

16. The communications device according to claim 15, wherein the second code block stream corresponds to at least one data unit;

one data unit in the at least one data unit comprises a head code block and at least one data code block, or one data unit in the at least one data unit comprises a head code block, at least one data code block, and a tail code block, or one data unit in the at least one data unit comprises at least one data code block and a tail code block; and the at least one data code block comprises at least one type-1 data code block, the bits corresponding to the code block in the Q first code block streams are carried in a payload area of a type-1 data code block in the at least one type-1 data code block in the second code block stream, and a quantity of bits carried in a payload area of one type-1 data code block in the second code block stream is M2.

17. The communications device according to claim 16, wherein the head code block is an S code block and/or the tail code block is a T code block.

18. The communications device according to claim 16, wherein the processor is configured to:

perform code-block-based time division multiplexing on the code blocks in the Q first code block streams to obtain a to-be-processed code block sequence, wherein each of the Q first code block streams corresponds to at least one slot, and an order of code blocks comprised in the to-be-processed code block sequence matches an order of slots corresponding to the code blocks comprised in the to-be-processed code block sequence; and place, in the to-be-sent second code block stream, bits corresponding to the to-be-processed code block sequence.

19. The communications device according to claim 18, wherein slot allocation indication information is carried in a preset code block in the second code block stream; and the slot allocation indication information indicates a correspondence between the Q first code block streams and slots.

20. The communications device according to claim 18, wherein the processor is configured to:
   compress R continuous code blocks in the to-be-processed code block sequence to obtain a compressed code block sequence, wherein R is a positive integer; and
   place, in the to-be-sent second code block stream, bits corresponding to the compressed code block sequence.

* * * * *